(12) United States Patent
Ozeki et al.

(10) Patent No.: US 8,223,533 B2
(45) Date of Patent: Jul. 17, 2012

(54) MAGNETORESISTIVE EFFECT DEVICE AND MAGNETIC MEMORY

(75) Inventors: Jyunichi Ozeki, Yokohama (JP);
 Naoharu Shimomura, Tokyo (JP);
 Sumio Ikegawa, Yokohama (JP);
 Tadashi Kai, Tokyo (JP); Masahiko Nakayama, Yokohama (JP); Hisanori Aikawa, Yokohama (JP); Tatsuya Kishi, Yokohama (JP); Hiroaki Yoda, Sagamihara (JP); Eiji Kitagawa, Yokohama (JP); Masatoshi Yoshikawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 449 days.

(21) Appl. No.: 12/556,883

(22) Filed: Sep. 10, 2009

(65) Prior Publication Data

US 2010/0080050 A1    Apr. 1, 2010

(30) Foreign Application Priority Data

Sep. 26, 2008 (JP) .................................. 2008-248633
Mar. 27, 2009 (JP) .................................. 2009-078799

(51) Int. Cl.
 *G11C 11/00* (2006.01)
(52) U.S. Cl. .......................... 365/158; 365/171; 365/173
(58) Field of Classification Search .................. 365/158, 365/171, 172, 173; 257/421, E21.665, E29.323
 See application file for complete search history.

(56) References Cited

U.S. PATENT DOCUMENTS

| | | | |
|---|---|---|---|
| 6,713,830 B2 | 3/2004 | Nishimura et al. | |
| 2004/0053078 A1 | 3/2004 | Kikitsu et al. | |
| 2006/0186445 A1* | 8/2006 | Katti | 257/295 |
| 2007/0086121 A1 | 4/2007 | Nagase et al. | |
| 2009/0213638 A1* | 8/2009 | Morise et al. | 365/145 |

FOREIGN PATENT DOCUMENTS

| | | |
|---|---|---|
| JP | 2000-307171 | 11/2000 |
| JP | 2002-232035 | 8/2002 |
| JP | 2002-280640 | 9/2002 |
| JP | 2005-19464 | 1/2005 |

(Continued)

OTHER PUBLICATIONS

Office Action issued Mar. 1, 2011, in Japanese Patent Application No. 2009-078799 with English translation.

(Continued)

*Primary Examiner* — Anh Phung
*Assistant Examiner* — Hien Nguyen
(74) *Attorney, Agent, or Firm* — Oblon, Spivak, McClelland, Maier & Neustadt, L.L.P.

(57) ABSTRACT

A magnetic memory includes a magnetoresistive effect device comprising: a first ferromagnetic layer that has magnetic anisotropy in a direction perpendicular to a film plane thereof; a first nonmagnetic layer that is provided on the first ferromagnetic layer; a first reference layer that is provided on the first nonmagnetic layer, has magnetic anisotropy in a direction perpendicular to a film plane thereof, has magnetization antiparallel to a magnetization direction of the first ferromagnetic layer, and has a film thickness that is 1/5.2 to 1/1.5 times as large as a film thickness of the first ferromagnetic layer in the direction perpendicular to the film plane; a second nonmagnetic layer that is provided on the first reference layer; and a storage layer that is provided on the second nonmagnetic layer, has magnetic anisotropy in a direction perpendicular to a film plane thereof, and has a magnetization direction varied by spin-polarized electrons caused by flowing the current to the magnetoresistive effect device.

11 Claims, 23 Drawing Sheets

FOREIGN PATENT DOCUMENTS

| JP | 2006-108316 | 4/2006 |
|----|-------------|--------|
| JP | 2007-142364 | 6/2007 |
| JP | 2008-10590  | 1/2008 |

OTHER PUBLICATIONS

T. Ikeda, et al., "GMR and TMR Films Using GdFe Alloy with Perpendicular Magnetization", Journal of the Magnetics Society of Japan, vol. 24, No. 4-2, 2000, pp. 563-566.

Naoki Nishimura, et al., "Magnetic tunnel junction device with perpendicular magnetization films for high-density magnetic random access memory", Journal of Applied Physics, vol. 91, No. 8, Apr. 15, 2002, pp. 5246-5249.

J.C. Slonczewski, "Current-driven excitation of magnetic multilayers", Journal of Magnetism and Magnetic Materials, vol. 159, No. 1-2, L1-7, 1996, 7 pages.

Office Action issued Sep. 21, 2010, in Japan Patent Application No. 2008-248633.

Office Action issued Sep. 27, 2011 in Japanese Patent Application No. 2008-248633 (with English translation).

* cited by examiner

MAGNETORESISTIVE EFFECT DEVICE AND MAGNETIC MEMORY

CROSS-REFERENCE TO RELATED APPLICATION

This application is based upon and claims the benefit of priority from prior Japanese Patent Applications Nos. 2008-248633 and 2009-78799 filed on Sep. 26, 2008 and Mar. 27, 2009 respectively in Japan, the entire contents of which are incorporated herein by reference.

BACKGROUND OF THE INVENTION

1. Field of the Invention

The present invention relates to a magnetoresistive effect device that is capable of recording information with a supply of bidirectional current, and a magnetic memory that includes the magnetoresistive effect device.

2. Related Art

A magnetoresistive random access memory (MRAM) that utilizes a tunneling magneto Resistive (TMR) effect characteristically stores data depending on the magnetization states of MTJ (Magnetic Tunnel Junction) devices. Generally, a MTJ device includes a magnetic layer called a storage layer, another magnetic layer called a reference layer, and a tunnel barrier layer interposed between the magnetic layers. Many techniques have been suggested for putting magnetoresistive random access memories into practice. For example, a yoke wiring structure has been suggested so as to reduce the write current. As for the structures of MTJ devices, a structure including a perpendicular magnetization film made of a GdFe alloy (see Ikeda, et al., "GMR and TMR Films Using GdFe Alloy with Perpendicular Magnetization", Journal of the Magnetics Society of Japan, Vol. 24, No. 4-2, 2000, p.p. 563-566), for example), a stacked structure including a perpendicular magnetization film (see N. Nishimura, et al., "Magnetic Tunnel Junction Device with Perpendicular Magnetization Films for High-Density Magnetic Random Access Memory", Journal of Applied Physics, Volume 91, Number 8, 15 Apr., 2002), and the like have been suggested.

In these suggested devices, the magnetic field write technique is utilized to reverse the magnetization direction of a magnetic layer with the use of a magnetic field generated from a current. A larger magnetic field can be generated from a larger amount of current, but the amount of current that can flow through the wirings is restricted due to miniaturization of devices. By employing a yoke structure in which the distance between the wirings and the magnetic layers is shortened or a magnetic field is concentrated in a certain region, the amount of current required for reversing the magnetization direction of a magnetic body can be reduced. However, a greater magnetic field is required for reversing the magnetization of a magnetic body due to miniaturization. Therefore, it is very difficult to restrict the amount of current to a small value and achieve miniaturization at the same time.

The reason that a greater magnetic field is required for reversing the magnetization of a magnetic body due to miniaturization is that a sufficient magnetic energy is required to overcome thermal agitation. To increase the magnetic energy, the magnetic anisotropy energy density and the volume of the magnetic body should be increased. However, since the volume becomes smaller due to miniaturization, the magnetic shape anisotropy energy or the magnetic crystalline anisotropy energy is normally used to increase the magnetic energy.

As described above, it is very difficult to restrict the amount of current to a small value and achieve miniaturization at the same time, since the reversal magnetic field is increased by the increase of the magnetic energy of the magnetic body. To counter this problem, a yoke structure of a completely closed magnetic circuit type has been suggested. This yoke structure includes a large perpendicular magnetization film that has a large magnetic crystalline anisotropy energy and maximum current field generation efficiency (see JP-A 2005-19464 (KOKAI), for example). In JP-A 2005-19464 (KOKAI), however, the yoke structure becomes large relative to the magnetic elements. As a result, the cell area becomes relatively large, and it is impossible to realize miniaturization, a smaller amount of current, and a reduction in cell area at the same time.

In recent years, magnetization reversals by spin-polarized current have been predicted in theory, and have also been confirmed through experiments. As a result, a MRAM that utilizes a spin-polarized current has been suggested (see J. C. Slonczewski, et al., "Current-Driven Excitation of Magnetic Multilayers", Journal of Magnetism and Magnetic Materials, Volume 159, Number 1-2, L1-7, 1996, for example). In this MRAM, a magnetization reversal in a magnetic body by an action of spin-polarized electrons can be realized simply by applying a spin-polarized current to the magnetic body. If the volume of the magnetic body is small, the amount of spin-polarized electrons can be small. Accordingly, this technique is expected to achieve miniaturization and restrict the amount of current to a small value at the same time. Furthermore, this technique does not involve the magnetic field generated by a current. Accordingly, the yoke structure to increase the magnetic field is not necessary, and the cell area can be reduced.

In this magnetization reversing technique involving a spin-polarized current, however, the problem of thermal agitation becomes prominent with further miniaturization. As described above, to maintain sufficient thermal agitation resistance, it is necessary to increase the magnetic anisotropy energy density. In a conventional structure of an in-plane magnetization type, magnetic shape anisotropy is normally utilized. Since the magnetic anisotropy is secured with the use of its shape in this case, the current required for a magnetization reversal is sensitive to the shape, and the variation in the reversal current becomes larger with further miniaturization. Also, the aspect ratio of the MTJ cells needs to be at least 1.5 or more. As a result, the cell size becomes larger. Furthermore, the crystal axis diverges in a large area in the plane in a case where the magnetic layers of the magnetoresistive effect device are of the in-plane magnetization type and utilize magnetic crystalline anisotropy, instead of magnetic shape anisotropy, or in a case where a material having high magnetic crystalline anisotropy energy density such as a Co—Cr alloy material is used as in a hard disk medium. In such cases, the MR (Magneto-Resistive) ratio becomes lower, and incoherent precessional movement is induced. As a result, the amount of reversal current becomes larger.

To maintain information nonvolatility, a larger magnetic anisotropy energy than the thermal agitation energy should be supplied to the storage layer of each MTJ device. To secure a sufficient magnetic anisotropy energy, the use of a so-called perpendicular magnetization film having a magnetization easy axis in a direction substantially perpendicular to the film plane (such as the upper face) of the magnetization film has been suggested (see JP-A 2005-19464 (KOKAI), for example). Compared with a so-called in-plane magnetization film having a magnetization easy axis in a direction substantially parallel to the film plane, a perpendicular magnetization film requires a smaller amount of write current to reverse its magnetization. Accordingly, the use of perpendicular magnetization films is expected to be essential in large-capacity memory development (see JP-A 2007-142364 (KOKAI), for example).

Each MTJ device includes a storage layer, a reference layer, and a tunnel barrier layer interposed between the storage layer and the reference layer. The storage layer and the reference layer are made of magnetic materials, and generate a magnetic field outward. In a MTJ device having a storage layer and a reference layer of a perpendicular magnetization type, the leakage magnetic field from the reference layer is normally larger than the leakage magnetic field generated in a MTJ device of an in-plane magnetization type. Also, the storage layer having smaller coercive force than the reference layer is greatly affected by the leakage magnetic field from the reference layer. More specifically, due to the influence of the leakage magnetic field from the reference layer, the amount of reversal current required for writing is increased, and the thermal stability becomes poorer.

For a MTJ device of a perpendicular magnetization type, a SAF (Synthetic Anti-Ferromagnetic) structure, a dual-pin structure, and the like have been suggested as the measures to reduce the leakage magnetic field applied to the storage layer from the reference layer. In a SAF structure, a film thickness difference is caused, so as to reduce the leakage magnetic field applied to the storage layer. If the SAF structure is of an in-plane magnetization type, a film thickness ratio of approximately 1.2 should be sufficient for reducing the leakage magnetic field applied to the storage layer.

However, if the SAF structure is of a perpendicular magnetization type, a film thickness ratio of approximately 1.2 cannot sufficiently reduce the leakage magnetic field applied to the storage layer, as discovered by the inventors and will be described later.

In a dual-pin structure, the leakage magnetic field applied to the storage layer in the perpendicular direction is reduced, but the leakage magnetic field in the in-plane direction is increased. As a result, the MR ratio becomes lower, and the amount of reversal current required for writing becomes larger.

Although there have been some reports on the measures to reduce the leakage current in a MTJ structure of a perpendicular magnetization type as described above, no specific measures to reduce the leakage current applied to the storage layer have been suggested.

SUMMARY OF THE INVENTION

The present invention has been made in view of these circumstances, and an object of the present invention is to provide a magnetoresistive effect device that is capable of minimizing the leakage magnetic field applied to the storage layer, and a magnetoresistive access memory that includes the magnetoresistive effect device.

A magnetoresistive access memory according to a first aspect of the present invention includes: a memory cell, the memory cell comprising: a magnetoresistive effect device; and a first electrode and a second electrode that flow a current to the magnetoresistive effect device, the magnetoresistive effect device comprising: a first ferromagnetic layer that has magnetic anisotropy in a direction perpendicular to a film plane thereof; a first nonmagnetic layer that is provided on the first ferromagnetic layer; a first reference layer that is provided on the first nonmagnetic layer, has magnetic anisotropy in a direction perpendicular to a film plane thereof, has magnetization antiparallel to a magnetization direction of the first ferromagnetic layer, and has a film thickness that is 1/5.2 to 1/1.5 times as large as a film thickness of the first ferromagnetic layer in the direction perpendicular to the film plane; a second nonmagnetic layer that is provided on the first reference layer; and a storage layer that is provided on the second nonmagnetic layer, has magnetic anisotropy in a direction perpendicular to a film plane thereof, and has a magnetization direction varied by spin-polarized electrons caused by flowing the current to the magnetoresistive effect device.

A magnetoresistive access memory according to a second aspect of the present invention includes: a memory cell, the memory cell comprising: a magnetoresistive effect device; and a first electrode and a second electrode that flow a current to the magnetoresistive effect device, the magnetoresistive effect device comprising: a storage layer that has magnetic anisotropy in a direction perpendicular to a film plane thereof, and has a magnetization direction varied by spin-polarized electrons caused by flowing the current to the magnetoresistive effect device; a first nonmagnetic layer that is provided on the storage layer; a reference layer that is provided on the first nonmagnetic layer, and has magnetic anisotropy in a direction perpendicular to a film plane thereof; a second nonmagnetic layer that is provided on the reference layer; and a ferromagnetic layer that is provided on the second nonmagnetic layer, has magnetic anisotropy in a direction perpendicular to a film plane thereof, has magnetization antiparallel to a magnetization direction of the reference layer, and has a film thickness 1.5 to 5.2 times as large as a film thickness of the reference layer in the direction perpendicular to the film plane.

A magnetoresistive access memory according to a third aspect of the present invention includes: a memory cell, the memory cell comprising: a magnetoresistive effect device; and a first electrode and a second electrode that flow a current to the magnetoresistive effect device, the magnetoresistive effect device comprising: a storage layer that has magnetic anisotropy in a direction perpendicular to a film plane thereof, and has a magnetization direction varied by spin-polarized electrons caused by flowing the current to the magnetoresistive effect device; a first nonmagnetic layer that is provided on the storage layer; a reference layer that is provided on the first nonmagnetic layer, and has magnetic anisotropy in a direction perpendicular to a film plane thereof; an antiferromagnetic layer that is provided on the reference layer; and a ferromagnetic layer that is provided on the antiferromagnetic layer, has magnetic anisotropy in a direction perpendicular to a film plane thereof, and has magnetization antiparallel to a magnetization direction of the reference layer.

A magnetoresistive access memory according to a fourth aspect of the present invention includes: a memory cell, the memory cell comprising: a magnetoresistive effect device; and a first electrode and a second electrode that flow a current to the magnetoresistive effect device, the magnetoresistive effect device comprising: a ferromagnetic layer that has magnetic anisotropy in a direction perpendicular to a film plane thereof; an antiferromagnetic layer that is provided on the ferromagnetic layer; a reference layer that is provided on the antiferromagnetic layer, has magnetic anisotropy in a direction perpendicular to a film plane thereof, and has magnetization antiparallel to a magnetization direction of the ferromagnetic layer; a first nonmagnetic layer that is provided on the reference layer; and a storage layer that is provided on the first nonmagnetic layer, has magnetic anisotropy in a direction perpendicular to a film plane thereof, and has a magnetization direction varied by spin-polarized electrons caused by flowing the current to the magnetoresistive effect device.

DETAILED DESCRIPTION OF THE INVENTION

Figure 1:
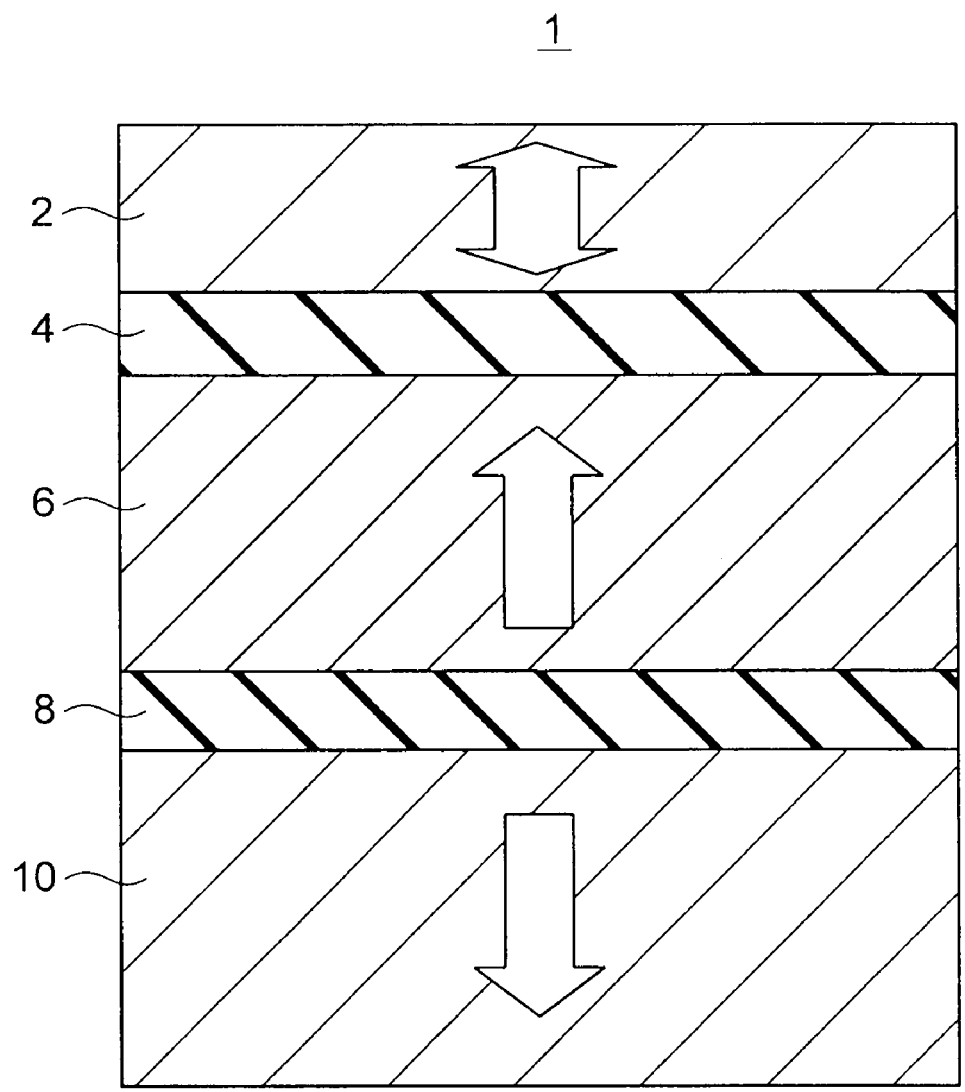
FIG. 1 is a cross-sectional view of a magnetoresistive effect device in accordance with a first embodiment.

The following is a description of embodiments of the present invention, with reference to the accompanying drawings. Throughout this description, like components are denoted by like reference numerals.

(First Embodiment)

FIG. 1 shows a magnetoresistive effect device in accordance with a first embodiment of the present invention. The magnetoresistive effect device of this embodiment is a MTJ device 1 of a single-pin structure. The MTJ device 1 of this embodiment has a stacked structure that includes a free magnetization layer (a storage layer) 2 formed with a magnetic layer, a reference layer 6 formed with a magnetic layer, a ferromagnetic layer 10 formed with a magnetic layer, a nonmagnetic layer 4 interposed between the storage layer 2 and the reference layer 6, and a nonmagnetic layer 8 interposed between the reference layer 6 and the ferromagnetic layer 10. Accordingly, the MTJ device 1 of this embodiment may be a stacked structure formed by stacking the ferromagnetic layer 10, the nonmagnetic layer 8, the reference layer 6, the nonmagnetic layer 4, and the storage layer 2 in this order (the stacked structure formed in the order illustrated in FIG. 1), or may be a stacked structure formed by stacking the storage layer 2, the nonmagnetic layer 4, the reference layer 6, the nonmagnetic layer 8, and the ferromagnetic layer 10 in this order (a stacked structure formed in the reverse order of the order illustrated in FIG. 1).

The MTJ device 1 of this embodiment is a MTJ device of a so-called perpendicular magnetization type in which the magnetization directions of the storage layer 2, the reference layer 6, and the ferromagnetic layer 10 are perpendicular to the film planes. In other words, the storage layer 2, the reference layer 6, and the ferromagnetic layer 10 have magnetic anisotropy in a direction perpendicular to the film planes. Here, the "film planes" are the upper faces of the respective layers. The magnetization direction of the storage layer 2 can be reversed by the action of spin-polarized electrons. The reference layer 6 and the ferromagnetic layer 10 are in an antiparallel magnetization relationship, having magnetization directions opposite to each other. The magnetization direction of the reference layer 6 is invariable before and after writing. If the nonmagnetic layer 4 is formed with an insulating material, this MTJ device 1 has a TMR effect. If the nonmagnetic layer 4 is formed with a metal, this MTJ device 1 has a GMR effect. Where the nonmagnetic layer 4 is formed with an insulating material, an insulating material such as MgO (magnesium oxide) or AlO (aluminum oxide, or $Al_2O_3$, for example) is used. Where the nonmagnetic layer 4 is formed with a metal, a metal such as Cu, Ag, or Au is used. If the ferromagnetic layer 10 has the same saturation magnetization Ms and the same film thickness t as the reference layer 6 in this structure, a leakage magnetic field applied to the storage layer 2 from the reference layer 6 cannot be completely cancelled.

To counter this problem, the inventors made intensive studies, and discovered the conditions among the parameters required for cancelling the film-plane perpendicular component Hz of the leakage magnetic field applied to the storage layer 2. Here, to "cancel" the film-plane perpendicular components Hz is to zero the areal average of the film-plane perpendicular component Hz of the leakage magnetic field applied to the mid face between the upper face and the lower face of the storage layer 2.

Figure 2:
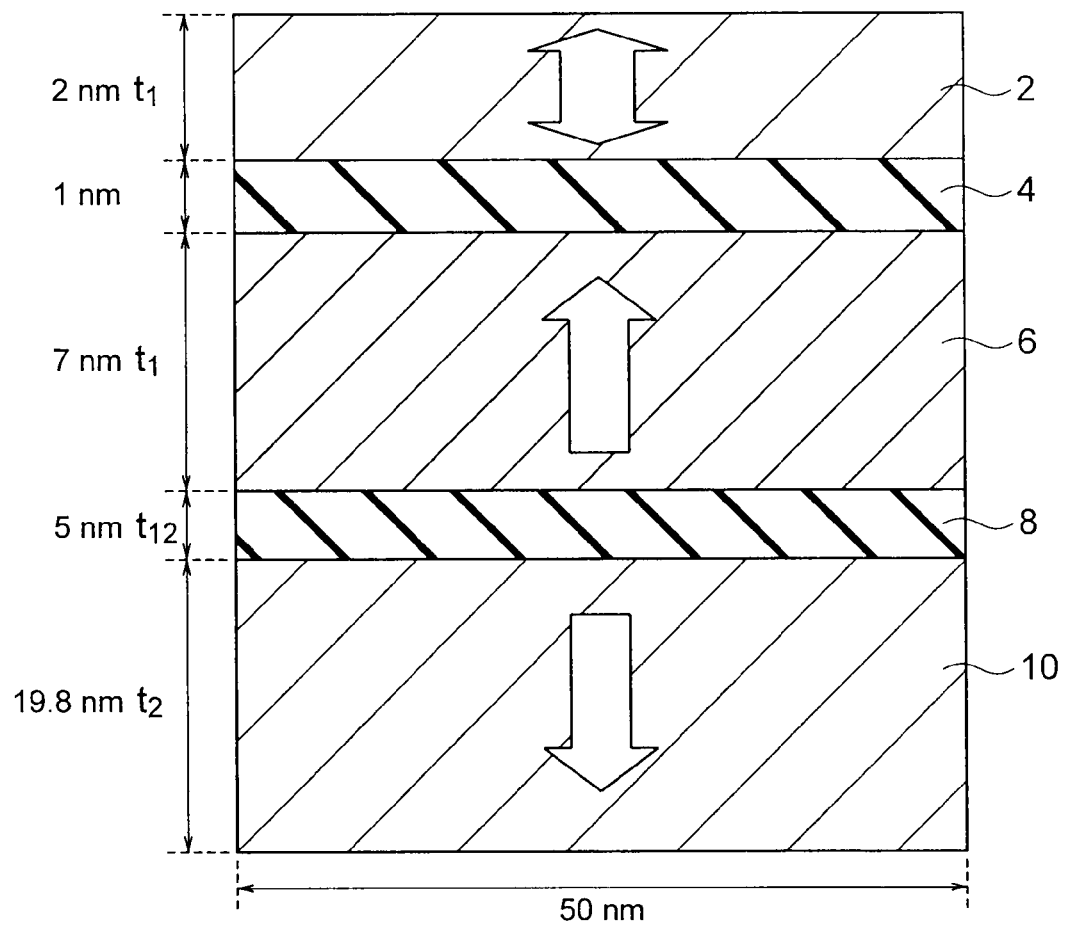
FIG. 2 is a cross-sectional view showing optimum film thicknesses in the magnetoresistive effect device of the first embodiment.

First, the optimum film thickness of the ferromagnetic layer 10 to cancel the film-plane perpendicular component Hz of the leakage magnetic field applied to the storage layer 2 is determined through a simulation in the MTJ device 1 having a cylindrical single-pin structure of 50 nm in diameter R shown in FIG. 2. The values of the parameters used in this simulation are as follows: the saturation magnetization Ms, the magnetic anisotropy constant Ku, and the film thickness t of the storage layer 2 are Ms=700 (emu/cm$^3$), Ku=4.7×10$^6$ (erg/cm$^3$), and t=2 (nm), respectively; and the saturation magnetization $Ms_1$, the magnetic anisotropy constant $Ku_1$, and the film thickness $t_1$ of the reference layer 6 are $Ms_1$=750 (emu/cm$^3$), $Ku_1$=20×10$^6$ (erg/cm$^3$), and $t_1$=7 (nm), respectively. Here, the thickness of the nonmagnetic layer 4 is 1 nm, and the thickness of the nonmagnetic layer 8 is 5 nm. The saturation magnetization $Ms_2$ and the magnetic anisotropy constant $Ku_2$ of the ferromagnetic layer 10 are $Ms_2$=1000 (emu/cm$^3$) and $Ku_2$=20×10$^6$ (erg/cm$^3$), respectively. If the film thickness $t_2$ is the optimum film thickness of the ferromagnetic layer 10 to cancel the film-plane perpendicular component Hz of the leakage magnetic field applied to the storage layer 2 from the reference layer 6 in this case, the film thickness $t_2$ is 19.80 nm as a result of the simulation.

Here, an interfacial magnetic layer having a high spin polarization rate may be provided at the interface between the magnetic layer (the storage layer 2 or the reference layer 6) in contact with the nonmagnetic layer 4. In such a case, the saturation magnetization $Ms_1$ is obtained by averaging the saturation magnetization of the reference layer 6 and the saturation magnetization of the interfacial magnetic layer.

Figure 3:
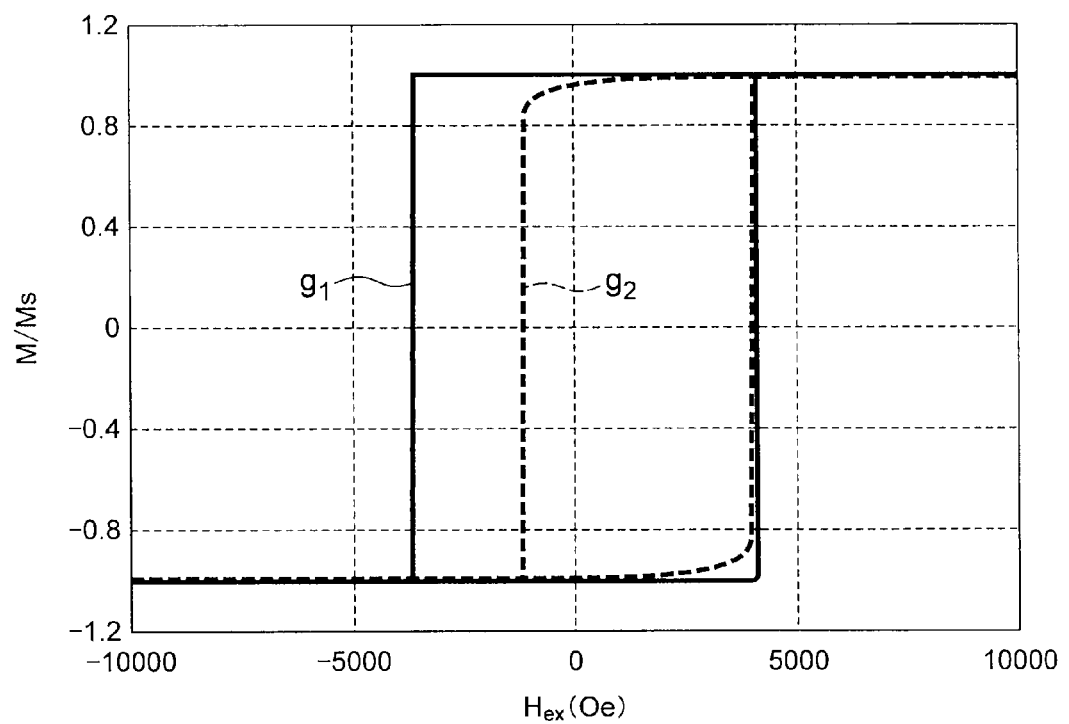
FIG. 3 is a diagram showing the M-H loop.

The graph $g_1$ in FIG. 3 represents the conditions for canceling the film-plane perpendicular component Hz of the leakage magnetic field, or the M-H loop of the MTJ device 1 in which the film thickness $t_2$ of the ferromagnetic layer 10 is 19.80 nm. The abscissa axis indicates the external magnetic field $H_{ex}$ applied to the MTJ device 1, and the ordinate axis indicates the magnetization obtained by normalizing the magnetization M of the storage layer 2 by the saturation magnetization Ms. In FIG. 3, the graph $g_2$ represents the M-H loop of a MTJ device having the same structure as the MTJ device 1 shown in FIG. 2, except that the ferromagnetic layer 10 is removed. As can be seen from these graphs, not only the shifting magnetic field but also the coercive force and the perpendicularity are improved by canceling the film-plane perpendicular component Hz of the leakage magnetic field.

The film thicknesses of the reference layer 6 and the nonmagnetic layer 8 are now described. It is preferable that the film thickness $t_1$ of the reference layer 6 is 5 nm or greater. If the film thickness of the reference layer 6 is smaller than 5 nm, the crystallinity becomes poorer, and the perpendicular magnetic anisotropy cannot be maintained. It is also preferable that the film thickness of the reference layer 6 is 7 nm or smaller. If the film thickness of the reference layer 6 exceeds 7 nm, the interface roughness between the reference layer 6 and the nonmagnetic layer 8 becomes greater. As a result, the crystallinity of the ferromagnetic layer 10 formed via the nonmagnetic layer 8 becomes poorer, and the perpendicular magnetic anisotropy cannot be maintained. In view of the above facts, the film thickness $t_1$ of the reference layer 6 is expected to satisfy the relationship: 5 nm$\leq t_1 \leq$7 nm.

It is preferable that the film thickness of the nonmagnetic layer 8 is 1 nm or greater. If the film thickness of the nonmagnetic layer 8 is smaller than 1 nm, the ferromagnetic interlayer bonding between the reference layer 6 and the ferromagnetic layer 10 is too strong, and it is difficult to create an antiparallel bonding state. It is also preferable that the film thickness of the nonmagnetic layer 8 is 5 nm or smaller. If the film thickness of the nonmagnetic layer 8 exceeds 5 nm, the interface roughness between the ferromagnetic layer 10 and the nonmagnetic layer 8 becomes greater. As a result, the crystallinity of the ferromagnetic layer 10 becomes poorer, and it becomes difficult to maintain the perpendicular magnetic anisotropy. In view of the above, the film thickness $t_{12}$ of the nonmagnetic layer 8 is expected to satisfy the relationship: 1 nm$\leq t_{12} \leq$5 nm.

Next, the film thickness $t_2$ of the ferromagnetic layer 10 required to cancel the film-plane perpendicular component Hz of the leakage magnetic field applied to the storage layer 2 in the MTJ device 1 is determined through simulations where the film thickness $t_1$ of the reference layer 6 is 5 nm, 6 nm, and 7 nm. The MTJ devices have the same diameter where the film thickness $t_1$ of the reference layer 6 is 5 nm, 6 nm, and 7 nm.

a) Where $t_1$ and $t_{12}$ are 5 nm and 1 nm, respectively, $t_2$ needs to be 7.52 nm. The value of the ratio between the film thickness $t_2$ and the film thickness $t_1$ ($=t_2/t_1$) in this case is 1.50

Where $t_1$ and $t_{12}$ are 5 nm and 3 nm, respectively, $t_2$ needs to be 8.96 nm. The value of the ratio between the film thickness $t_2$ and the film thickness $t_1$ ($=t_2/t_1$) in this case is 1.79

Where $t_1$ and $t_{12}$ are 5 nm and 5 nm, respectively, $t_2$ needs to be 10.9 nm. The value of the ratio between the film thickness $t_2$ and the film thickness $t_1$ ($=t_2/t_1$) in this case is 2.18.

Accordingly, where $t_1$ is 5 nm, the value of the ratio between the film thickness $t_2$ and the film thickness $t_1$ ($=t_2/t_1$) satisfies the relationship: 1.50$\leq t_2/t_1 \leq$2.18.

b) Where $t_1$ and $t_{12}$ are 6 nm and 1 nm, respectively, $t_2$ needs to be 9.75 nm. The value of the ratio between the film thickness $t_2$ and the film thickness $t_1$ ($=t_2/t_1$) in this case is 1.63.

Where $t_1$ and $t_{12}$ are 6 nm and 3 nm, respectively, $t_2$ needs to be 12.01 nm. The value of the ratio between the film thickness $t_2$ and the film thickness $t_1$ ($=t_2/t_1$) in this case is 2.00.

Where $t_1$ and $t_{12}$ are 6 nm and 5 nm, respectively, $t_2$ needs to be 14.76 nm. The value of the ratio between the film thickness $t_2$ and the film thickness $t_1$ ($=t_2/t_1$) in this case is 2.46.

Accordingly, where $t_1$ is 6 nm, the value of the ratio between the film thickness $t_2$ and the film thickness $t_1$ ($=t_2/t_1$) satisfies the relationship: 1.63$\leq t_2/t_1 \leq$2.46.

c) Where $t_1$ and $t_{12}$ are 7 nm and 1 nm, respectively, $t_2$ needs to be 12.73 nm. The value of the ratio between the film thickness $t_2$ and the film thickness $t_1$ ($=t_2/t_1$) in this case is 1.82.

Where $t_1$ and $t_{12}$ are 7 nm and 3 nm, respectively, $t_2$ needs to be 15.84 nm. The value of the ratio between the film thickness $t_2$ and the film thickness $t_1$ ($=t_2/t_1$) in this case is 2.26.

Where $t_1$ and $t_{12}$ are 7 nm and 5 nm, respectively, $t_2$ needs to be 19.81 nm. The value of the ratio between the film thickness $t_2$ and the film thickness $t_1$ ($=t_2/t_1$) in this case is 2.83

Accordingly, where $t_1$ is 7 nm, the value of the ratio between the film thickness $t_2$ and the film thickness $t_1$ ($=t_2/t_1$) satisfies the relationship: 1.82$\leq t_2/t_1 \leq$2.83.

Figure 4:
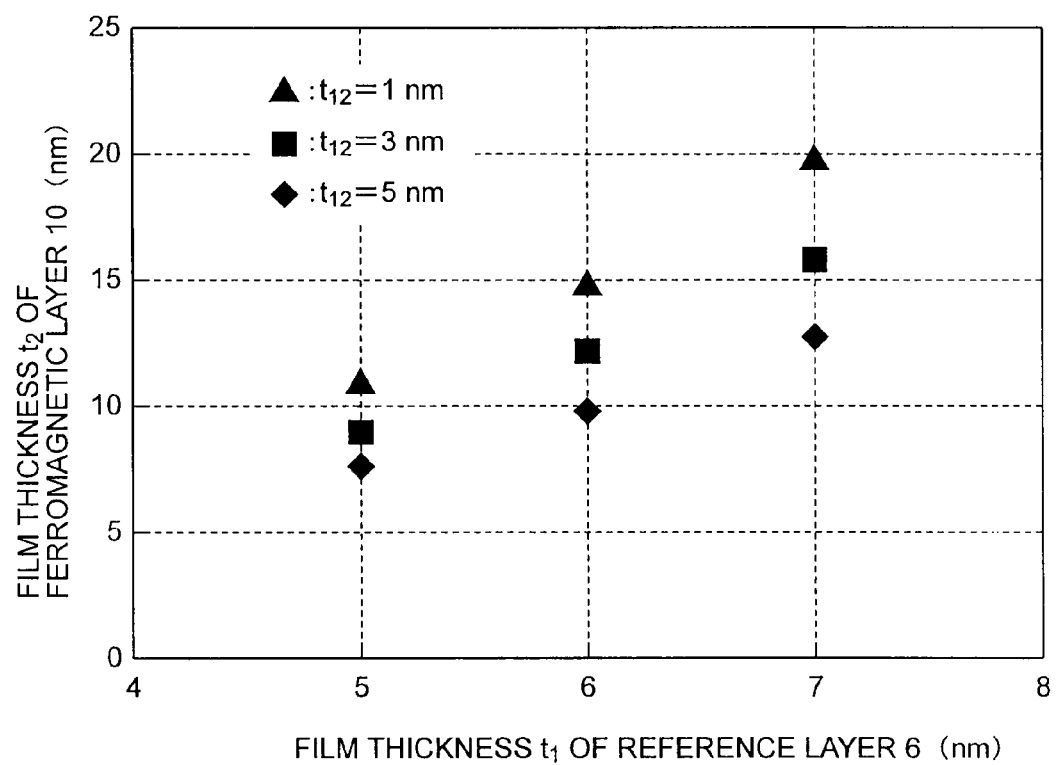
FIG. 4 is a diagram showing relationships between the film thickness of the ferromagnetic layer and the film thickness of the ferromagnetic layer.

The results of the simulations are shown in FIG. 4. FIG. 4 is a diagram showing relationships between the film thickness of the ferromagnetic layer and the film thickness of the ferromagnetic layer observed in a case where the conditions for canceling the film-plane perpendicular component of the leakage magnetic field are satisfied. In FIG. 4, the values are determined, with the film thickness $t_{12}$ of the nonmagnetic layer 8 between the reference layer 6 and the ferromagnetic layer 10 being the parameter, which is 1 nm, 3 nm, and 5 nm.

Figure 5:
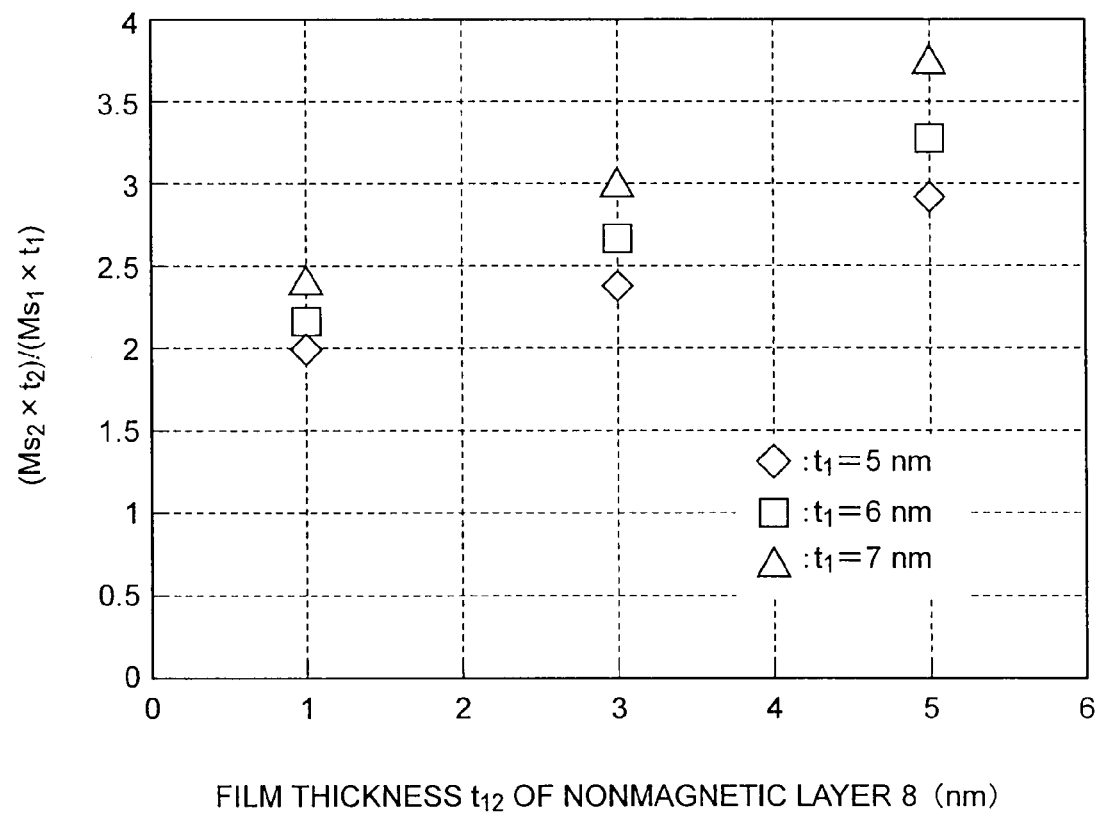
FIG. 5 is a diagram showing the dependence of the ferromagnetic layer and the reference layer on the film thickness of the nonmagnetic layer.

FIG. 5 shows the results of speculations made about MTJ devices in which the film thickness $t_{12}$ of the nonmagnetic layer 8 is 1 nm, 3 nm, and 5 nm. The MTJ devices have the same diameter where the film thickness $t_{12}$ of the nonmagnetic layer 8 is 1 nm, 3 nm, and 5 nm. The graph in FIG. 5 is formed by plotting the ratio $((Ms_2 \times t_2)/(Ms_1 \times t_1))$ between the product $(Ms_2 \times t_2)$ of the saturation magnetization $Ms_2$ of the ferromagnetic layer 10 and the film thickness $t_2$ of the ferromagnetic layer 10, and the product $(Ms_1 \times t_1)$ of the saturation magnetization $Ms_1$ of the reference layer 6 and the film thickness $t_1$ of the reference layer 6, which are required for canceling the film-plane perpendicular component Hz of the leakage magnetic field applied to the storage layer 2 in the respective cases. In FIG. 5, the values are determined, with the film thickness $t_1$ of the reference layer 6 being the parameter, which is 5 nm, 6 nm, and 7 nm. As can be seen from FIG. 5, it is preferable that the ratio $((Ms_2 \times t_2)/(Ms_1 \times t_1))$ satisfies the following relationship:

$$2.0 \leq (Ms_2 \times t_2)/(Ms_1 \times t_1) \leq 3.8.$$

Next, the film thickness $t_2$ of the ferromagnetic layer 10 required for canceling the film-plane perpendicular component Hz of the leakage magnetic field applied to the storage layer 2 is determined through simulations performed on MTJ devices 1 of 50 nm, 40 nm, 35 nm, and 30 nm in diameter R. When a MTJ film is processed into a MTJ device of a finite size, it is desirable that the total film thickness $t_3$ of the nonmagnetic layer 4, and (=the film thickness of the nonmagnetic layer $4 + t_1 + t_{12} + t_2$) is in the range of 30 nm±10%. If the total film thickness $t_3$ of the nonmagnetic layer 4, and becomes greater than 30 nm±10%, damage to the MTJ device from the processing apparatus becomes too large, and it becomes difficult to form a desired shape.

a) Where $t_{12}$ and D are 1 nm and 50 nm, respectively, $t_2$ needs to be 12.73 nm. The film thickness $t_3$ in this case is 21.73 nm.

Where $t_{12}$ and D are 1 nm and 40 nm, respectively, $t_2$ needs to be 15.71 nm. The film thickness $t_3$ in this case is 24.71 nm.

Where $t_{12}$ and D are 1 nm and 35 nm, respectively, $t_2$ needs to be 18.98 nm. The film thickness $t_3$ in this case is 27.98 nm.

Where $t_{12}$ and D are 1 nm and 30 nm, respectively, $t_2$ needs to be 26.83 nm. The film thickness $t_3$ in this case is 35.83 nm.

b) Where $t_{12}$ and D are 3 nm and 50 nm, respectively, $t_2$ needs to be 13.80 nm. The film thickness $t_3$ in this case is 24.80 nm.

Where $t_{12}$ and D are 3 nm and 40 nm, respectively, $t_2$ needs to be 21.54 nm. The film thickness $t_3$ in this case is 32.54 nm.

Where $t_{12}$ and D are 1 nm and 35 nm, respectively, $t_2$ needs to be 29.01 nm. The film thickness $t_3$ in this case is 40.01 nm.

Where $t_{12}$ and D are 3 nm and 30 nm, respectively, $t_2$ needs to be 26.81 nm. The film thickness $t_3$ in this case is 37.81 nm.

c) Where $t_{12}$ and D are 5 nm and 50 nm, respectively, $t_2$ needs to be 19.63 nm. The film thickness $t_3$ in this case is 32.63 nm.

Where $t_{12}$ and D are 5 nm and 40 nm, respectively, $t_2$ needs to be 30.71 nm. The film thickness $t_3$ in this case is 43.71 nm.

Where $t_{12}$ and D are 1 nm and 35 nm, respectively, $t_2$ needs to be 54.05 nm. The film thickness $t_3$ in this case is 67.05 nm.

Where $t_{12}$ and D are 5 nm and 30 nm, respectively, $t_2$ needs to be 58.80 nm. The film thickness $t_3$ in this case is 71.80 nm.

Figure 6:
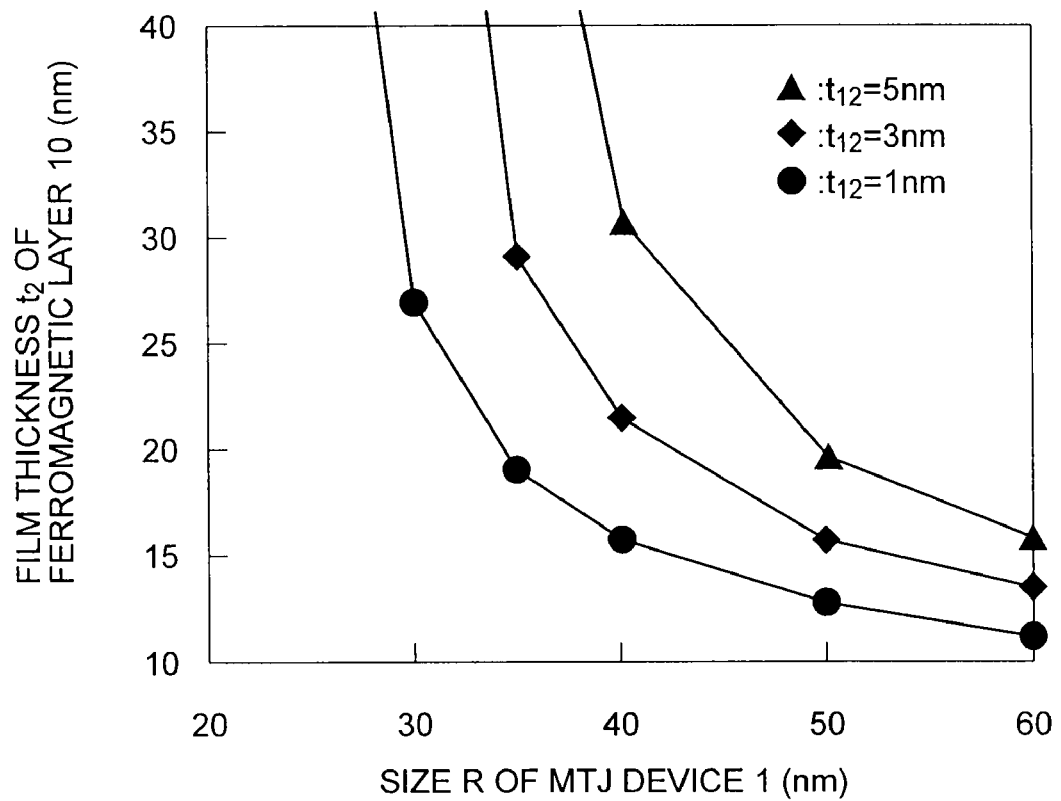
FIG. 6 is a diagram showing relationships between the film thickness of the ferromagnetic layer and the MTJ device size.

The results of the simulations are shown in FIG. 6. FIG. 6 is a diagram showing relationships between the film thickness of the ferromagnetic layer and the MTJ device size observed in a case where the conditions for canceling the film-plane perpendicular component of the leakage magnetic field are satisfied. The logarithm of the film thickness $t_2$ (nm) of the ferromagnetic layer 10 is expressed as a linear function of the reciprocal of the cube of the diameter R (nm). More specifically, there is the relationship, $t_2 = a_0 \exp(b_0/R^3)$, between the film thickness $t_2$ and the diameter R. Here, the coefficients $a_0$ and $b_0$, and the saturation magnetization $Ms_1$ satisfy the following proportional relationships:

$$a_0 = Ms_1/80 + 0.3$$

$$b_0 = 64Ms_1 - 1900$$

Figure 7:
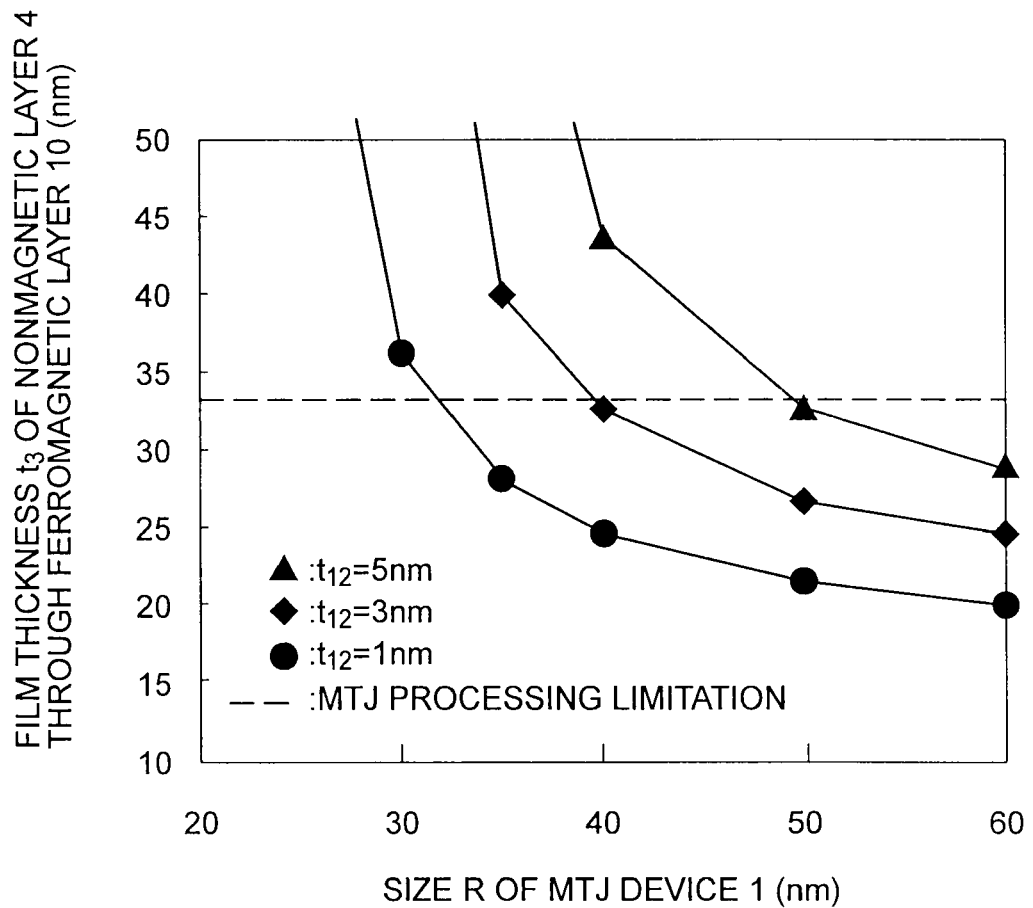
FIG. 7 is a diagram showing relationships between the total film thickness of the layers from the nonmagnetic layer to the ferromagnetic layer and the MTJ device size.

FIG. 7 shows the results of simulations performed on the film thickness $t_3$. FIG. 7 is a diagram showing relationships between the total film thickness of the layers from the nonmagnetic layer to the ferromagnetic layer and the MTJ device size observed in a case where the conditions for canceling the film-plane perpendicular component of the leakage magnetic field are satisfied. Where the film thickness $t_{12}$ is 1 nm, the film thickness $t_3$ stays within the processable film thickness range of 30 nm±10% up to a point where the MTJ size R is approximately 35 nm. Where the film thickness $t_{12}$ is 3 nm, the film thickness $t_3$ stays within the processable film thickness range of 30 nm±10% up to a point where the MTJ size R is approximately 40 nm. Where the film thickness $t_{12}$ is 5 nm, the film thickness $t_3$ stays within the processable film thickness range of 30 nm±10% up to a point where the MTJ size R is approximately 50 nm. In view of the above facts, where the saturation magnetization $Ms_1$ of the reference layer 6 is 750 (emu/cm$^3$), the film thickness $t_3$ reaches its limit around a point where the MTJ size R is 35 nm.

The MTJ size R can be further reduced by reducing the saturation magnetization $Ms_1$ of the film thickness $t_1$ of the reference layer 6, which is a cause of the leakage magnetic field.

Figure 8:
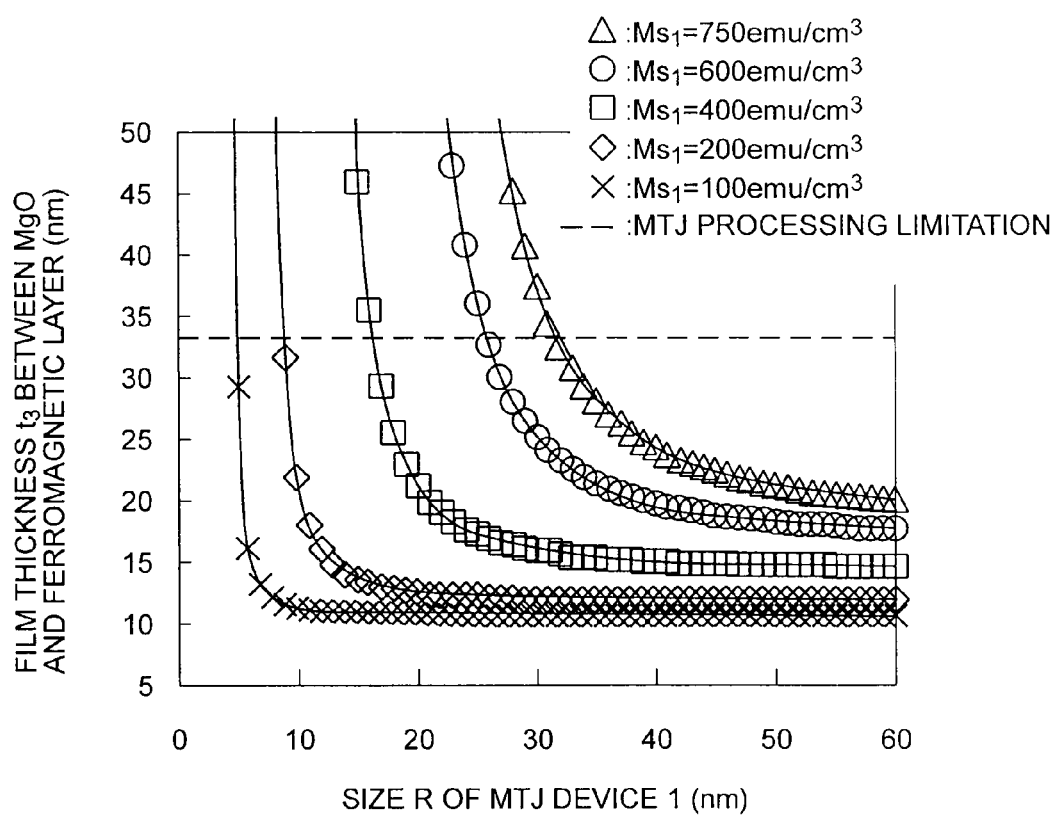
FIG. 8 is a diagram showing relationships between the total film thickness of the layers from the nonmagnetic layer to the ferromagnetic layer and the MTJ device size.

In view of this, the film thickness $t_2$ of the ferromagnetic layer 10 required for canceling the film-plane perpendicular component Hz of the leakage magnetic field applied to the storage layer 2 is determined according to the above relational expressions in MTJ devices 1 in which the saturation magnetization $Ms_1$ of the reference layer 6 is 600 (emu/cm$^3$), 400 (emu/cm$^3$), 200 (emu/cm$^3$), and 100 (emu/cm$^3$). FIG. 8 shows the results of the calculations. FIG. 8 is a diagram showing relationships between the total film thickness of the layers from the nonmagnetic layer to the ferromagnetic layer and the MTJ device size observed in a case where the conditions for canceling the film-plane perpendicular component of the leakage magnetic field are satisfied. As can be seen from FIG. 8, the diameter R that satisfies the processing requirements is greatly reduced by reducing the saturation magnetization $Ms_1$ of the reference layer 6.

Next, the film thickness $t_2$ of the ferromagnetic layer 10 required for canceling the film-plane perpendicular component Hz of the leakage magnetic field applied to the storage layer 2 is determined through simulations performed on MTJ devices 1 in which the film thickness $t_1$ of the reference layer 6 is 5 nm, which is the smallest, and the film thickness $t_{12}$ of the nonmagnetic layer 8 is 1 nm, 3 nm, and 5 nm.

a) Where $Ms_1$, D, and $t_{12}$ are 600 (emu/cm$^3$), 30 nm, and 1 nm, respectively, $t_2$ needs to be 7.54 nm. The value of the ratio between the film thickness $t_2$ and the film thickness $t_1$ ($=t_2/t_1$) in this case is 1.51.

Where $Ms_1$, D, and $t_{12}$ are 600 (emu/cm$^3$), 30 nm, and 3 nm, respectively, $t_2$ needs to be 10.10 nm. The value of the ratio between the film thickness $t_2$ and the film thickness $t_1$ ($=t_2/t_1$) in this case is 2.02.

Where $Ms_1$, D, and $t_{12}$ are 600 (emu/cm$^3$), 30 nm, and 5 nm, respectively, $t_2$ needs to be 14.30 nm. The value of the ratio between the film thickness $t_2$ and the film thickness $t_1$ ($=t_2/t_1$) in this case is 2.86.

Accordingly, where $Ms_1$ and D are 600 (emu/cm³), and 30 nm, respectively, the value of the ratio between the film thickness $t_2$ and the film thickness $t_1$ (=$t_2/t_1$) satisfies the relationship: $1.51 \leq t_2/t_1 \leq 2.86$.

b) Where $Ms_1$, D, and $t_{12}$ are 600 (emu/cm³), 26 nm, and 1 nm, respectively, $t_2$ needs to be 8.30 nm. The value of the ratio between the film thickness $t_2$ and the film thickness $t_1$ (=$t_2/t_1$) in this case is 1.66.

Where $Ms_1$, D, and $t_{12}$ are 600 (emu/cm³), 26 nm, and 3 nm, respectively, $t_2$ needs to be 12.40 nm. The value of the ratio between the film thickness $t_2$ and the film thickness $t_1$ (=$t_2/t_1$) in this case is 2.48.

Where $Ms_1$, D, and $t_{12}$ are 600 (emu/cm³), 26 nm, and 5 nm, respectively, $t_2$ needs to be 19.70 nm. The value of the ratio between the film thickness $t_2$ and the film thickness $t_1$ (=$t_2/t_1$) in this case is 3.94.

Accordingly, where $Ms_1$ and D are 600 (emu/cm³), and 26 nm, respectively, the value of the ratio between the film thickness $t_2$ and the film thickness $t_1$ (=$t_2/t_1$) satisfies the relationship: $1.66 \leq t_2/t_1 \leq 3.94$.

c) Where $Ms_1$, D, and $t_{12}$ are 600 (emu/cm³), 24 nm, and 1 nm, respectively, $t_2$ needs to be 9.10 nm. The value of the ratio between the film thickness $t_2$ and the film thickness $t_1$ (=$t_2/t_1$) in this case is 1.82.

Where $Ms_1$, D, and $t_{12}$ are 600 (emu/cm³), 24 nm, and 3 nm, respectively, $t_2$ needs to be 14.50 nm. The value of the ratio between the film thickness $t_2$ and the film thickness $t_1$ (=$t_2/t_1$) in this case is 2.90.

Where $Ms_1$, D, and $t_{12}$ are 600 (emu/cm³), 24 nm, and 5 nm, respectively, $t_2$ needs to be 26.00 nm. The value of the ratio between the film thickness $t_2$ and the film thickness $t_1$ (=$t_2/t_1$) in this case is 5.20.

Accordingly, where $Ms_1$ and D are 600 (emu/cm³), and 24 nm, respectively, the value of the ratio between the film thickness $t_2$ and the film thickness $t_1$ (=$t_2/t_1$) satisfies the relationship: $1.82 \leq t_2/t_1 \leq 5.20$.

d) Where $Ms_1$, D, and $t_{12}$ are 400 (emu/cm³), 18 nm, and 1 nm, respectively, $t_2$ needs to be 7.63 nm. The value of the ratio between the film thickness $t_2$ and the film thickness $t_1$ (=$t_2/t_1$) in this case is 1.53.

Where $Ms_1$, D, and $t_{12}$ are 400 (emu/cm³), 18 nm, and 3 nm, respectively, $t_2$ needs to be 11.00 nm. The value of the ratio between the film thickness $t_2$ and the film thickness $t_1$ (=$t_2/t_1$) in this case is 2.20.

Where $Ms_1$, D, and $t_{12}$ are 400 (emu/cm³), 18 nm, and 5 nm, respectively, $t_2$ needs to be 21.50 nm. The value of the ratio between the film thickness $t_2$ and the film thickness $t_1$ (=$t_2/t_1$) in this case is 4.30.

Accordingly, where $Ms_1$ and D are 400 (emu/cm³), and 18 nm, respectively, the value of the ratio between the film thickness $t_2$ and the film thickness $t_1$ (=$t_2/t_1$) satisfies the relationship: $1.53 \leq t_2/t_1 \leq 4.30$.

Figure 9:
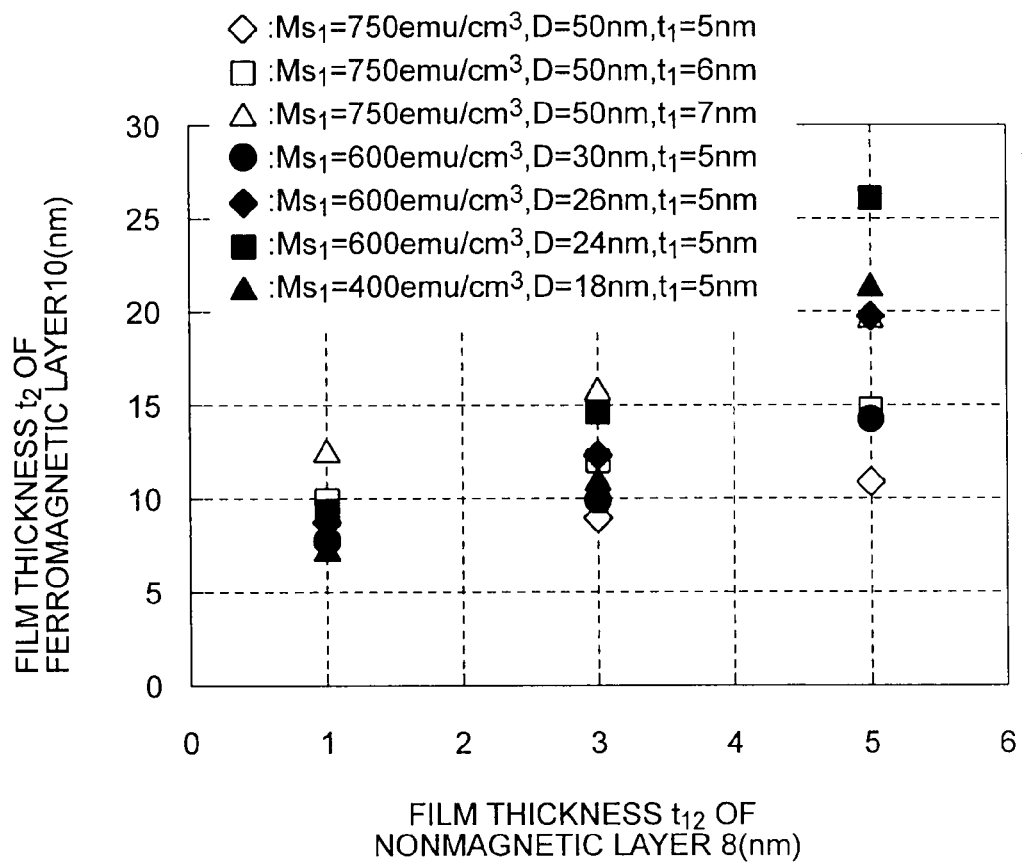
FIG. 9 is a diagram showing relationships between the film thickness of the ferromagnetic layer and the film thickness of the nonmagnetic layer.

FIG. 9 shows the results of the simulations. FIG. 9 is a diagram showing relationships between the film thickness of the ferromagnetic layer and the film thickness of the nonmagnetic layer observed in a case where the conditions for canceling the film-plane perpendicular component of the leakage magnetic field are satisfied. In FIG. 9, the values are determined, with the film thickness $t_{12}$ of the nonmagnetic layer 8 between the reference layer 6 and the ferromagnetic layer 10 being the parameter, which is 1 nm, 3 nm, and 5 nm. FIG. 9 also shows the results of the simulations shown in FIG. 4.

Figure 10:
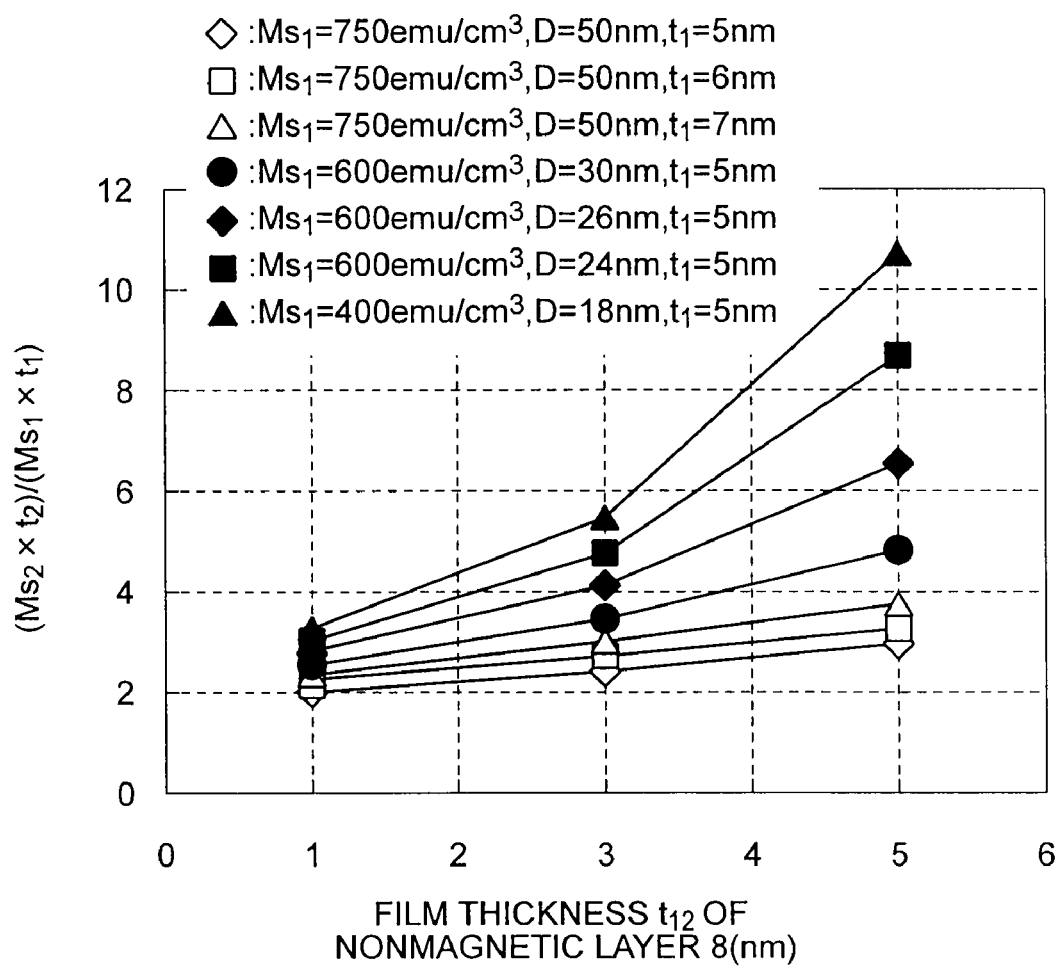
FIG. 10 is a diagram showing the dependence of the ferromagnetic layer and the reference layer on the film thickness of the nonmagnetic layer.

FIG. 10 shows the results of speculations made about MTJ devices in which the film thickness $t_{12}$ of the nonmagnetic layer 8 is 1 nm, 3 nm, and 5 nm. FIG. 10 is a diagram showing the dependence of the ferromagnetic layer and the reference layer on the film thickness of the nonmagnetic layer observed in a case where the conditions for canceling the film-plane perpendicular component of the leakage magnetic field are satisfied. The graph in FIG. 10 is formed by plotting the ratio (($Ms_2 \times t_2$)/($Ms_1 \times t_1$)) between the product ($Ms_2 \times t_2$) of the saturation magnetization $Ms_2$ of the ferromagnetic layer 10 and the film thickness $t_2$ of the ferromagnetic layer 10, and the product ($Ms_1 \times t_1$) of the saturation magnetization $Ms_1$ of the reference layer 6 and the film thickness $t_1$ of the reference layer 6, which are required for canceling the film-plane perpendicular component Hz of the leakage magnetic field applied to the storage layer 2 in the respective cases. FIG. 10 also shows the results of the speculations shown in FIG. 5.

In view of the above, to cancel the film-plane perpendicular component Hz of the leakage magnetic field applied to the storage layer 2, the film thickness $t_2$ of the ferromagnetic layer 10 needs to be 1.5 to 5.2 times as large as the film thickness $t_{12}$ (1 nm $\leq t_{12} \leq$ 5 nm) of the nonmagnetic layer 8 interposed between the reference layer 6 and the ferromagnetic layer 10.

As can be seen from FIG. 10, it is preferable that the corresponding ratio (($Ms_2 \times t_2$)/($Ms_1 \times t_1$)) satisfies the following relationship:

$$2.0 \leq (Ms_2 \times t_2)/(Ms_1 \times t_1) \leq 10.75.$$

To cancel the film-plane perpendicular component Hz of the leakage magnetic field applied to the storage layer 2, it is also preferable that the relationship, $T_1 < T_2$, is satisfied, where $T_1$ represents the Curie temperature of the reference layer 6, and $T_2$ represents the Curie temperature of the ferromagnetic layer 10. To reduce the film-plane perpendicular component Hz of the leakage magnetic field applied to the storage layer 2, it is preferable that the relationship, $Ms_1 < Ms_2$, is satisfied. If the Curie temperature $T_2$ of the ferromagnetic layer 10 is higher than the Curie temperature $T_1$ of the reference layer 6, the relationship, $Ms_1 < Ms_2$, can be always maintained. Therefore, it is preferable that the Curie temperature $T_1$ of the reference layer 6 and the Curie temperature $T_2$ of the ferromagnetic layer 10 satisfy the relationship, $T_1 < T_2$.

(Second Embodiment)

Figure 11:
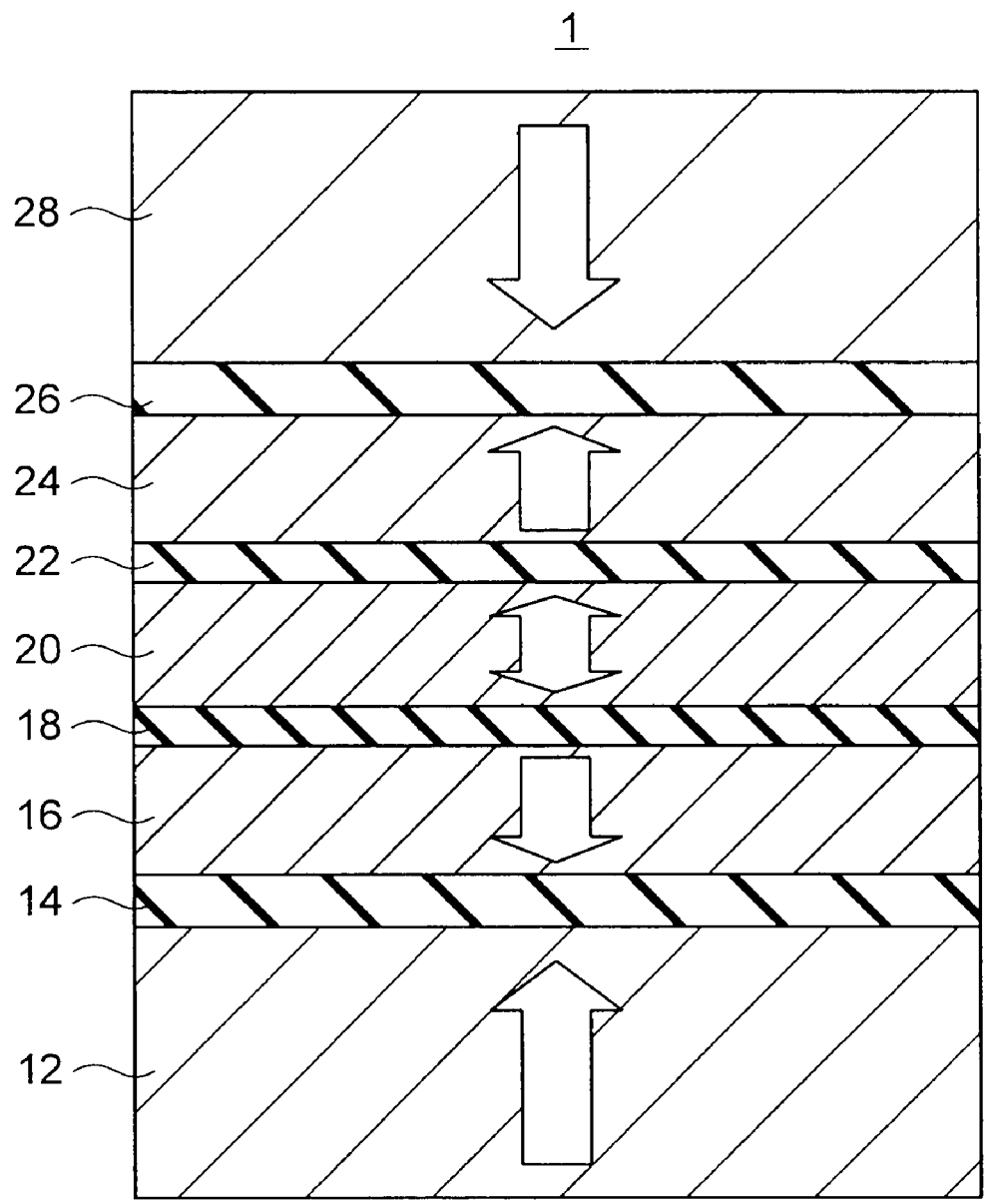
FIG. 11 is a cross-sectional view of a magnetoresistive effect device in accordance with a second embodiment.

FIG. 11 shows a magnetoresistive effect device in accordance with a second embodiment of the present invention. The magnetoresistive effect device of this embodiment is a MTJ device 1 of a dual-pin structure. The MTJ device 1 of this embodiment has a stacked structure that is formed by stacking a ferromagnetic layer 12, a nonmagnetic layer 14, a reference layer 16, a nonmagnetic layer 18, a storage layer 20, a nonmagnetic layer 22, a reference layer 24, a nonmagnetic layer 26, and a ferromagnetic layer 28 in this order. Alternatively, the MTJ device 1 of this embodiment may have a stacked structure that is formed by stacking the ferromagnetic layer 28, the nonmagnetic layer 26, the reference layer 24, the nonmagnetic layer 22, the storage layer 20, the nonmagnetic layer 18, the reference layer 16, the nonmagnetic layer 14, and the ferromagnetic layer 12 in this order, which is the reverse order of the order illustrated in FIG. 11.

The reference layers 16 and 24, the ferromagnetic layers 28, and the storage layer 20 are made of a perpendicular magnetization material having perpendicular magnetic anisotropy. The MTJ device 1 of this embodiment is a MTJ device of a so-called perpendicular magnetization type in which the magnetization directions of the storage layer 20, the reference layers 16 and 24, and the ferromagnetic layers 12 and 28 are perpendicular to the film planes. In other words, the storage layer 20, the reference layers 16 and 24, and the ferromagnetic layers 12 and 28 have magnetic anisotropy in a direction perpendicular to the film planes. Here, the "film planes" are the upper faces of the respective layers. The magnetization direction of the storage layer 20 can be reversed by the action of spin-polarized electrons. In the dual-pin structure, the reference layer 16 and the reference layer 24 are in an antiparallel magnetization relationship, having magnetization directions opposite to each other. Likewise, the ferromagnetic layer 12 and the ferromagnetic layer 28 are in an antiparallel magnetization relationship, having magnetization directions opposite to each other. The reference layer 16 and the ferromagnetic layer 12 are in an antiparallel magnetization relationship, having magnetization directions opposite to each other. Likewise, the reference layer 24 and the ferromagnetic layer 28 are in an antiparallel magnetization relationship, having magnetization directions opposite to each other.

If the nonmagnetic layers 18 and 22 are formed with an insulating material, this MTJ device 1 has a TMR effect. If the nonmagnetic layers 18 and 22 are formed with a metal, this MTJ device 1 has a GMR effect. Where the nonmagnetic layers 18 and 22 are formed with an insulating material, an insulating material such as MgO (magnesium oxide) or AlO (aluminum oxide, or $Al_2O_3$, for example) is used. Where the nonmagnetic layers 18 and 22 are formed with a metal, a metal such as Cu, Ag, or Au is used. If the ferromagnetic layers 12 and 28 have the same saturation magnetization Ms and the same film thicknesses t as the reference layers 16 and 24 in this structure, a leakage magnetic field applied to the storage layer 20 from the reference layers 16 and 24 cannot be completely cancelled.

To counter this problem, the inventors made intensive studies, and discovered the conditions among the parameters required for cancelling the film-plane perpendicular component Hz of the leakage magnetic field applied to the storage layer 20. Here, to "cancel" the film-plane perpendicular component Hz is to zero the areal average of the film-plane perpendicular component Hz of the leakage magnetic field applied to the storage layer 20.

Figure 12:
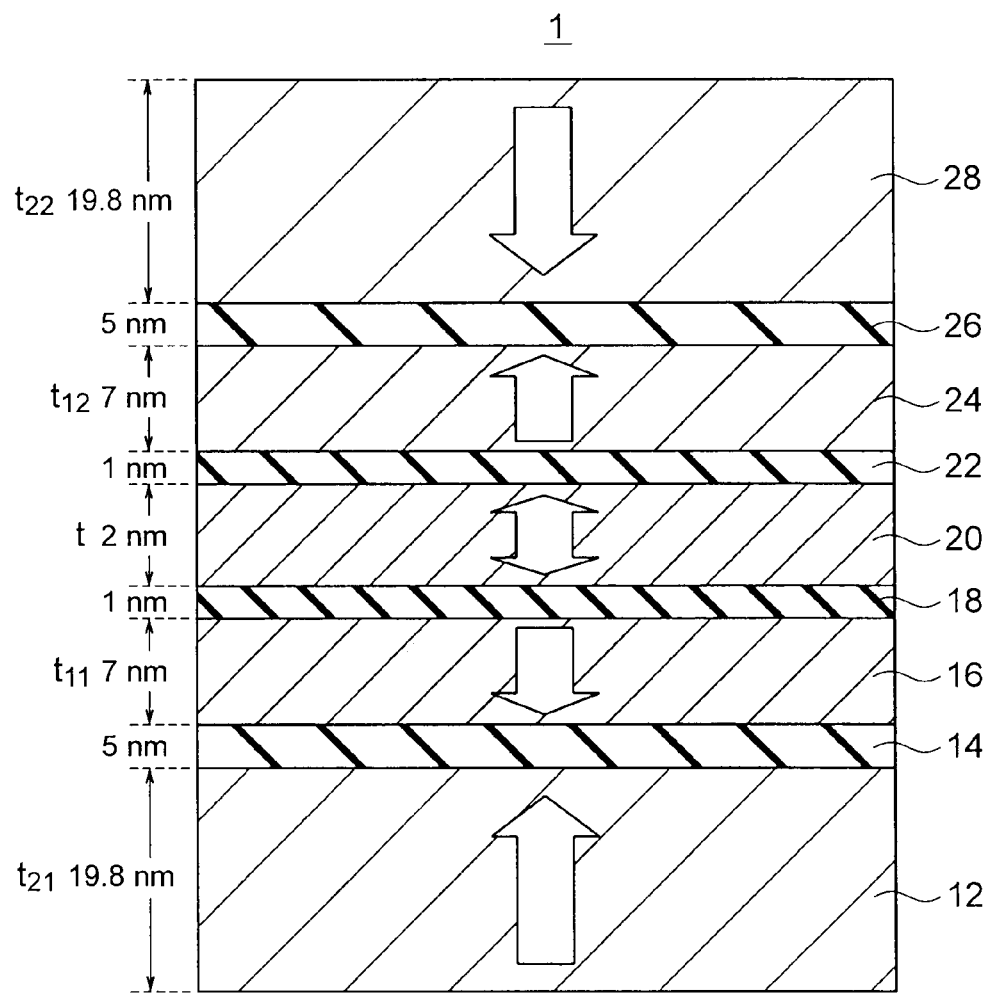
FIG. 12 is a cross-sectional view showing optimum film thicknesses in the magnetoresistive effect device of the second embodiment.

First, the optimum film thicknesses of the ferromagnetic layers 12 and 28 to cancel the film-plane perpendicular component Hz of the leakage magnetic field applied to the storage layer 20 are determined through a simulation in the MTJ device 1 having a cylindrical dual-pin structure of 50 nm in diameter R shown in FIG. 12.

The values of the parameters used in this simulation are as follows: the saturation magnetization Ms, the magnetic anisotropy constant Ku, and the film thickness t of the storage layer 20 are Ms=700 (emu/$cm^3$), Ku=4.7×$10^6$ (erg/$cm^3$), and t=2 (nm), respectively; and the saturation magnetization $Ms_{11}$ and saturation magnetization $Ms_{12}$, the magnetic anisotropy constants $Ku_{11}$ and $Ku_{12}$, and the film thicknesses $t_{11}$ and $t_{12}$ of the reference layers 16 and 24 are $Ms_{11}$=$Ms_{12}$=750 (emu/$cm^3$), $Ku_{11}$=$Ku_{12}$=20×$10^6$ (erg/$cm^3$), and $t_{11}$=$t_{12}$=7 (nm), respectively. Here, the thicknesses of the nonmagnetic layers 18 and 22 are both 1 nm, and the thicknesses of the nonmagnetic layers 14 and 26 are both 5 nm. The saturation magnetization $Ms_{21}$ and saturation magnetization $Ms_{22}$, and the magnetic anisotropy constants $Ku_{11}$ and $Ku_{22}$ of the ferromagnetic layers 12 and 28 are $Ms_{21}$=$Ms_{22}$=1000 (emu/$cm^3$) and $Ku_{21}$=$Ku_{22}$=20×$10^6$ (erg/$cm^3$), respectively. In this case, the optimum film thicknesses $t_{21}$ and $t_{22}$ of the ferromagnetic layers 12 and 28 to cancel the film-plane perpendicular component Hz of the leakage magnetic field supplied to the storage layer 20 from the reference layers 16 and 24 are the same, which are $t_{21}$=$t_{22}$=19.80 nm.

The results of the above simulation are the same as the results obtained in a case where the ferromagnetic layer 12, the nonmagnetic layer 14, the reference layer 16, the nonmagnetic layer 18, and the storage layer 20 constitute one MTJ device, while the storage layer 20, the nonmagnetic layer 22, the reference layer 24, the nonmagnetic layer 26, and the ferromagnetic layer 28 constitute another MTJ device. In view of this, to cancel the film-plane perpendicular component Hz of the leakage magnetic field applied to the storage layer 20, the film thickness $t_{21}$ of the ferromagnetic layer 12 needs to be 1.5 to 5.2 times as large as the film thickness $t_{11}$ (5 nm≦$t_{11}$≦7 nm) of the reference layer 16, and the film thickness $t_{22}$ of the ferromagnetic layer 28 needs to be 1.5 to 5.2 times as large as the film thickness $t_{12}$ (5 nm≦$t_{12}$≦7 nm) of the reference layer 24, as in the first embodiment.

Where $Ms_{11}$ and $Ms_{12}$ represent the saturation magnetization of the reference layer 16 and the saturation magnetization of the reference layer 24, respectively, $t_{11}$ and $t_{12}$ represent the film thicknesses of the reference layers 16 and 24, $Ms_{21}$ and $Ms_{22}$ represent the saturation magnetization of the ferromagnetic layer 12 and the saturation magnetization of the ferromagnetic layer 28, respectively, and $t_{21}$ and $t_{22}$ represent the film thicknesses of the ferromagnetic layers 12 and 28, respectively, it is preferable that the following relationships are satisfied:

$$2.0 \leq (Ms_{21} \times t_{21})/(Ms_{11} \times t_{11}) \leq 10.75, \text{ and}$$

$$2.0 \leq (Ms_{22} \times t_{22})/(Ms_{12} \times t_{12}) \leq 10.75.$$

To cancel the film-plane perpendicular component Hz of the leakage magnetic field applied to the storage layer 20, the relationships, $T_1 < T_2$ and $T_3 < T_4$, may also be satisfied, where $T_1$ represents the Curie temperature of the reference layer 16, $T_2$ represents the Curie temperature of the ferromagnetic layer 12, $T_3$ represents the Curie temperature of the reference layer 24, and $T_4$ represents the Curie temperature of the ferromagnetic layer 28.

If the above conditions are satisfied, the film-plane perpendicular component Hz of the leakage magnetic field applied to the storage layer 20 can be canceled.

Next, the magnetic materials used for the reference layers having perpendicular magnetization and the ferromagnetic layers having perpendicular magnetization in accordance with the first and second embodiments are described.

The perpendicular magnetization films used in the MTJ devices of the above embodiments basically contain at least one element selected from the group consisting of Fe (iron), Co (cobalt), Ni (nickel), and Mn (manganese), and at least one element selected from the group consisting of Pt (platinum), Pd (palladium), Ir (iridium), Rh (rhodium), Os (osmium), Au (gold), Ag (silver), Cu (copper), and Cr (chromium). Further, to adjust the saturation magnetization, control the magnetic crystalline anisotropy energy, and adjust the crystal grain size and intergranular coupling, at least one element selected from the group consisting of B (boron), C (carbon), Si (silicon), Al (aluminum), Mg (magnesium), Ta (tantalum), Zr (zirconium), Ti (titanium), Hf (hafnium), Y (yttrium), and rare-earth elements may be added to the perpendicular magnetization films.

Specific examples of Co-containing materials include Co—Pt alloys and Co—Pd alloys. Particularly, a Co—Cr—Pt alloy, a Co—Cr—Ta alloy, a Co—Cr—Pt—Ta alloy, and the like each have a HCP (Hexagonal Closest Packaging) structure. The magnetic crystalline anisotropy energy can be adjusted within the range of 1×$10^5$ to 1×$10^7$ erg/cc, by adjusting the compositions of the respective elements. Here, "—" represents alloy.

A Co—Pt alloy forms a $L1_0$—CoPt ordered alloy in a composition domain in the neighborhood of $Co_{50}Pt_{50}$ atomic %. This ordered alloy has a FCT (Face-Centered Tetragonal) structure. Where MgO (100) is used as a nonmagnetic layer, a (001) plane-oriented FCT-CoPt ordered alloy is preferable, being able to reduce the interface misfit with the nonmagnetic layer.

Specific examples of Fe-containing materials include Fe—Pt alloys and Fe—Pd alloys. Particularly, Fe—Pt alloys are ordered with a composition of $Fe_{50}Pt_{50}$ (atomic %), and have a $L1_0$ structure having a FCT structure as the fundamental structure. Accordingly, a large magnetic crystalline anisotropy energy equal to or more than $1 \times 10^7$ erg/cc can be developed.

A $Fe_{50}Pt_{50}$ alloy has a FCC (Face-Centered Cubic) structure before ordered. The magnetic crystalline anisotropy energy in this case is approximately $1 \times 10^6$ erg/cc. Accordingly, the magnetic crystalline anisotropy energy can be adjusted within the range of $5 \times 10^5$ to $5 \times 10^8$ erg/cc, by adjusting the annealing temperature and the composition, controlling the degree of ordering in the stacked structure, and adding an additional material.

More specifically, the saturation magnetization (Ms) and the magnetic crystalline anisotropy energy (Ku) of a Fe—Pt alloy can be controlled by adding Cu or V (vanadium) to the Fe—Pt alloy. Especially, V lowers the damping constant (the magnetization damping constant), a decrease of which is essential in a spin-injection magnetization reversal, and also reduces the reversal current.

A Fe—Pt ordered alloy has a FCT structure, but has a FCC structure before ordered. Accordingly, a Fe—Pt ordered alloy has excellent compatibility with MgO (100). More specifically, (100) plane-oriented BCC (Body-Centered Cubic)-Fe is grown on a MgO (100) plane, and Pt (100) is stacked thereon. In this manner, a Fe—Pt ordered alloy that is grown in a (100) plane orientation preferential manner on MgO (100) can be formed. It is also desirable that BCC—Cr is formed between the Fe—Pt ordered alloy and the MgO (100), because the (100) plane orientation of the Fe—Pt ordered alloy becomes preferential.

In the case of forming a Fe—Pt ordered alloys, if a multilayer structure of [Fe/Pt]n (n being an integer) is formed, a Fe—Pt ordered alloy with almost ideal order can be obtained. In this case, it is desirable that the Fe and Pt film thicknesses are in the range of 0.1 nm to 1 nm. Such film thicknesses are essential in creating a uniform composition state, and, in the case of ordering a Fe—Pt alloy, a martensitic transformation from a FCC structure into a FCT structure is facilitated with such film thicknesses.

Also, the ordering temperature for a Fe—Pt alloy is as high as 500 degrees Celsius or higher, and a Fe—Pt alloy excels in heat resistance. In this aspect, a Fe—Pt alloy is very preferable, having resistance to the annealing process in a later stage. Also, by adding an element such as Cu or V, the ordering temperature can be lowered.

A ferromagnetic material formed with mixed crystals of a metallic magnetic phase and an insulating phase may be used for the perpendicular magnetization films used in the MTJ devices of the above embodiments. In this case, the metallic magnetic phase is formed with a ferromagnetic material that contains at least one element selected from the group consisting of Fe, Co, Ni, and Mn, and at least one element selected from the group consisting of Pt, Pd, Ir, Rh, Os, Au, Ag, Cu, Cr, Ta, and rare-earth elements. The insulating phase is formed with an oxide, a nitride, or an oxynitride that contains at least one element selected from the group consisting of B, C, Si, Al, Mg, Ta, Cr, Zr, Ti, Hf, Y, and rare-earth elements.

A ferromagnetic material formed with mixed crystals of a metallic magnetic phase and an insulating phase is divided into a metallic magnetic part having conductivity, and an insulating part. Because of this, the current concentrates in the metallic magnetic part, and the energized area becomes smaller, leading to a local increase in current density. Accordingly, the ferromagnetic material substantially reduces the required reversal current.

To achieve such effects, it is necessary to control crystallinity. Examples of two-phase separated structures include granular-type structures, island-type structures, and columnar-type structures. In a columnar-type structure, the metallic magnetic part vertically penetrates through magnetic layers, and accordingly, a current reduction effect is easily achieved. In a granular-type structure or an island-type structure, the current flows through a path having the smallest tunnel barrier, and accordingly, a current reduction effect is achieved as in a columnar-type structure.

Other than the above, Mn-based ferromagnetic alloys or Cr-based ferromagnetic alloys may be used for the perpendicular magnetization films used in the MTJ devices of the above embodiments. Examples of Mn-based ferromagnetic alloys include Mn—Al alloys, Mn—Au alloys, Mn—Zn alloys, Mn—Ga alloys, Mn—Ir alloys, and Mn—$Pt_3$ alloys. Each of these alloys characteristically has an ordered lattice. Examples of Cr-based ferromagnetic alloys include Cr—$Pt_3$ alloys. Each of these alloys also has an ordered lattice.

In each of the MTJ devices of the first and second embodiments, a magnetic layer that cancels the leakage magnetic field from a reference layer is provided so as to reduce the leakage magnetic field applied to the storage layer from the reference layer. Where a material that has almost the same saturation magnetization as the reference layer is used for the magnetic layer that cancels the leakage magnetic field from the reference layer, the film thickness of the magnetic layer that cancels the leakage magnetic field from the reference layer needs to be made greater than the film thickness the reference layer. As a result, the film thickness of the MTJ device becomes greater, and the production costs become higher.

To counter this problem, the MTJ device of the following embodiment has a structure that can reduce the film thickness of the magnetic layer used to cancel the leakage magnetic field applied to the storage layer.

(Third Embodiment)

Figure 13:
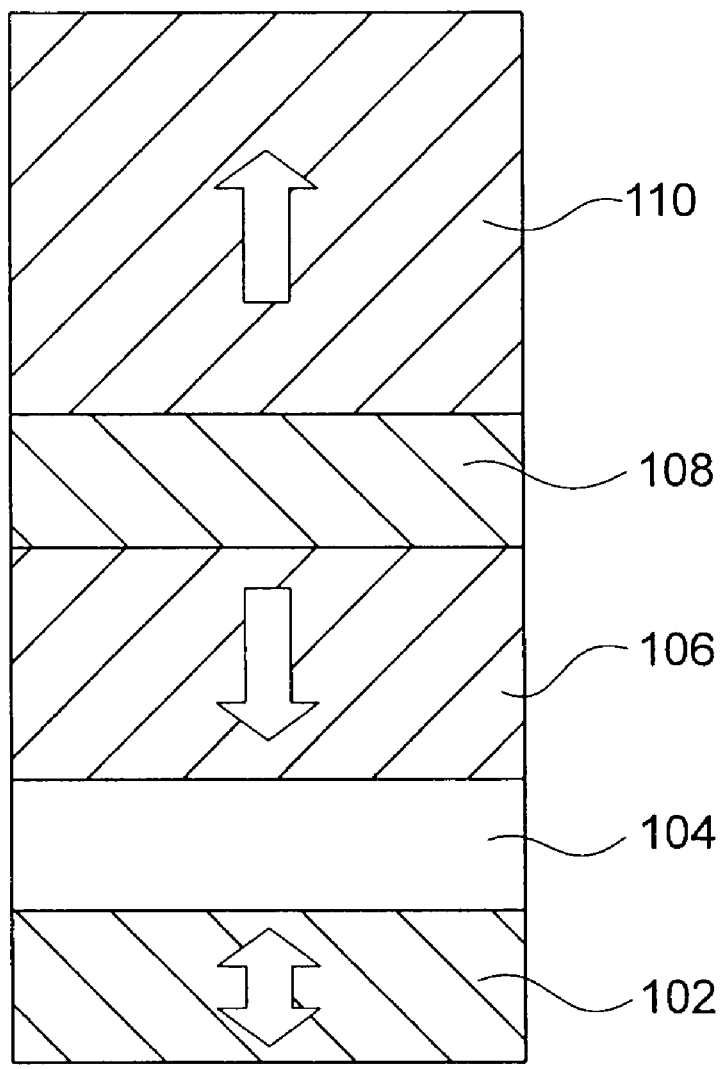
FIG. 13 is a cross-sectional view of a magnetoresistive effect device in accordance with a third embodiment.

FIG. 13 shows a magnetoresistive effect device in accordance with a third embodiment of the present invention. The magnetoresistive effect device of this embodiment is a MTJ device 1 of a single-pin structure. The MTJ device 1 of this embodiment has a stacked structure that includes a storage layer 102 formed with a magnetic layer, a reference layer 106 formed with a magnetic layer, a ferromagnetic layer 110 formed with a magnetic layer, a nonmagnetic layer 104 interposed between the storage layer 102 and the reference layer 106, and an antiferromagnetic layer 108 interposed between the reference layer 106 and the ferromagnetic layer 110. Accordingly, the MTJ device 1 of this embodiment may be a stacked structure formed by stacking the storage layer 102, the nonmagnetic layer 104, the reference layer 106, the antiferromagnetic layer 108, and the ferromagnetic layer 110 in this order (the stacked structure formed in the order illustrated in FIG. 13), or may be a stacked structure formed by stacking the ferromagnetic layer 110, the antiferromagnetic layer 108, the reference layer 106, the nonmagnetic layer 104, and the storage layer 102 in this order (a stacked structure formed in the reverse order of the order illustrated in FIG. 13).

The MTJ device 1 of this embodiment is a MTJ device of a so-called perpendicular magnetization type in which the magnetization directions of the storage layer 102, the reference layer 106, and the ferromagnetic layer 110 are perpendicular to the film planes. In other words, the storage layer 102, the reference layer 106, and the ferromagnetic layer 110 have magnetic anisotropy in a direction perpendicular to the film planes. Here, the "film planes" are the upper faces of the respective layers. The magnetization direction of the storage layer 102 can be reversed by the action of spin-polarized electrons. The reference layer 106 and the ferromagnetic layer 110 are in an antiparallel magnetization relationship, having magnetization directions opposite to each other. If the nonmagnetic layer 104 is formed with an insulating material, this MTJ device 1 has a TMR effect. If the nonmagnetic layer 104 is formed with a metal, this MTJ device 1 has a GMR effect. Where the nonmagnetic layer 104 is formed with an insulating material, an insulating material such as MgO (magnesium oxide) or AlO (aluminum oxide, or $Al_2O_3$, for example) is used. Where the nonmagnetic layer 104 is formed with a metal, a metal such as Cu, Au, or Ag is used. An alloy containing at least one 3d transition element selected from the group consisting of Mn, Cr, and Fe, or an alloy containing a heavy rare-earth element and a transition metal element is used for the antiferromagnetic layer 108. For example, an alloy such as IrMn, PtMn, FeMn, or FeRh is used as the alloy containing at least one 3d transition element. An alloy such as TbCoFe or GdCo is used as the alloy containing a heavy rare-earth element and a transition metal element.

Next, a method for reversing the magnetization direction of the storage layer 102 in this MTJ device 1 is described. If the magnetization direction of the storage layer 102 is opposite to the magnetization direction of the reference layer 106, or if the magnetization direction of the storage layer 102 is an upward direction in FIG. 13, the electron current (in the opposite direction to the regular current direction) flows through the ferromagnetic layer 110, the antiferromagnetic layer 108, the reference layer 106, the nonmagnetic layer 104, and the storage layer 102 in this order. In this case, the electron current is spin-polarized by the reference layer 106. The electrons spin-polarized in the same direction as the storage layer 102 pass through the storage layer 102, but the electrons spin-polarized in the opposite direction to the magnetization direction of the storage layer 102 apply a spin torque to the magnetization of the storage layer 102. As a result, the magnetization direction of the storage layer 102 is reversed.

If the magnetization direction of the storage layer 102 is the same as the magnetization direction of the reference layer 106, or if the magnetization direction of the storage layer 102 is a downward direction in FIG. 13, the electron current flows through the storage layer 102, the nonmagnetic layer 104, the reference layer 106, the antiferromagnetic layer 108, and the ferromagnetic layer 110 in this order. In this case, the electron current is spin-polarized by the storage layer 102. The electron current spin-polarized in the same direction as the storage layer 102 passes through the reference layer 106, but the electrons spin-polarized in the opposite direction to the magnetization direction of the reference layer 106 are reflected by the reference layer 106. The reflected electrons flow into the storage layer 102 via the nonmagnetic layer 104, and apply a spin torque to the magnetization of the storage layer 102. As a result, the magnetization direction of the storage layer 102 is reversed.

Where the reference layer 106 and the ferromagnetic layer 110 are formed with materials having the same saturation magnetization Ms in the MTJ device 1 having the above structure, if the film thickness t of the ferromagnetic layer 110 is made the same as the film thickness of the reference layer 106, the leakage magnetic field applied to the storage layer 102 from the reference layer 106 cannot be completely canceled.

To counter this problem, the inventors made intensive studies, and discovered the conditions among the parameters required for cancelling the film-plane perpendicular component Hz of the leakage magnetic field applied to the storage layer 102. Here, to "cancel" the film-plane perpendicular components Hz is to zero the areal average of the film-plane perpendicular component Hz of the leakage magnetic field applied to the storage layer 102.

First, the optimum film thickness of the ferromagnetic layer 110 to cancel the film-plane perpendicular component Hz of the leakage magnetic field applied to the storage layer 2 is determined through a simulation using a LLG (Landau-Lifshitz-Gilbert) equation in the MTJ device 1 having a cylindrical single-pin structure of 50 nm in diameter R. The values of the parameters used in this simulation are as follows: the saturation magnetization Ms, the magnetic anisotropy constant Ku, and the film thickness t of the storage layer 102 are Ms=1000 (emu/cm$^3$), Ku=6×10$^6$ (erg/cm$^3$), and t=3 (nm), respectively; and the saturation magnetization $Ms_1$, the magnetic anisotropy constant $Ku_1$, and the film thickness $t_1$ of the reference layer 106 are $Ms_1$=1000 (emu/cm$^3$), $Ku_1$=7×10$^6$ (erg/cm$^3$), and $t_1$=5 (nm), respectively. Here, the thickness of the nonmagnetic layer 104 is 1 nm, and the thickness of the antiferromagnetic layer 108 is 3 nm. The saturation magnetization $Ms_2$ and the magnetic anisotropy constant $Ku_2$ of the ferromagnetic layer 110 are $Ms_2$=1000 (emu/cm$^3$) and $Ku_2$=20×10$^6$ (erg/cm$^3$), respectively. To stabilize the magnetization of the reference layer 106 in the opposite direction to the magnetization direction of the ferromagnetic layer 110, the antiferromagnetic layer 108 provides exchange coupling equivalent to 3000 Oe magnetic field application to the reference layer 106.

Figure 14:
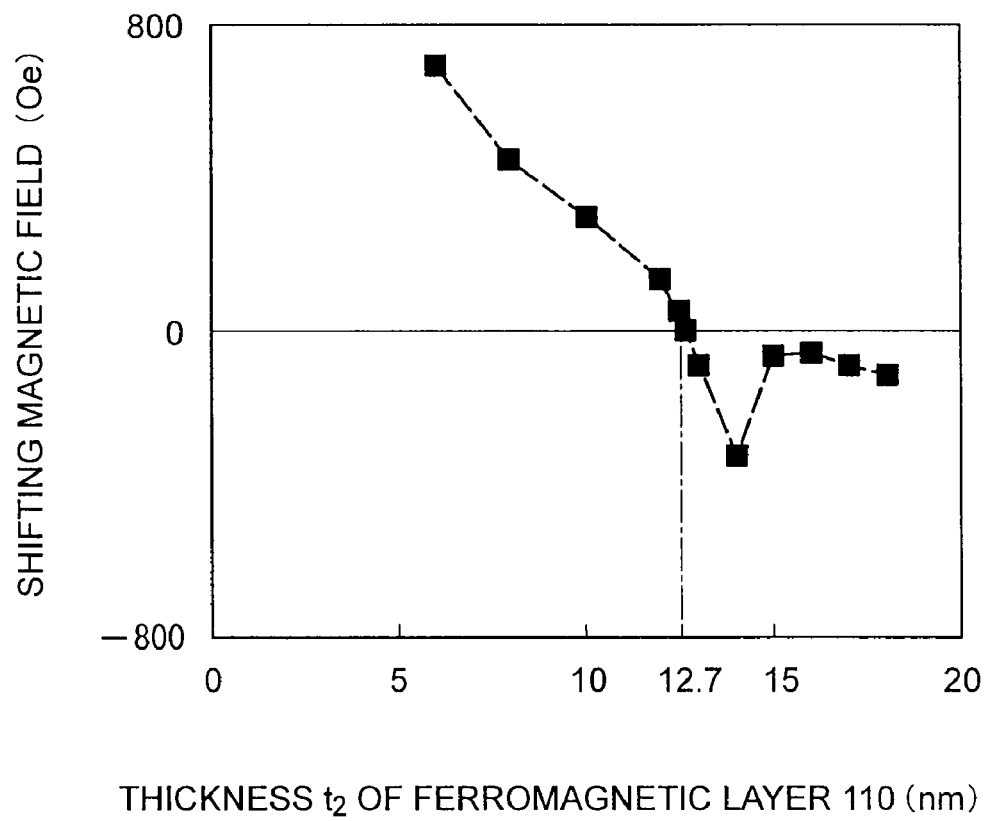
FIG. 14 is a diagram showing the dependence of the shifting magnetic field of the storage layer on the film thickness of the ferromagnetic layer in the third embodiment.

The film thickness $t_2$ is the film thickness of the ferromagnetic layer 110 to cancel the film-plane perpendicular component Hz of the leakage magnetic field applied to the storage layer 102 from the reference layer 106 in this case. FIG. 14 is a graph formed by plotting the size of the shifting magnetic field of the storage layer 102 with respect to the film thickness $t_2$. As the film thickness $t_2$ becomes greater, the shifting magnetic field becomes smaller and reaches zero where the film thickness $t_2$ is 12.7 nm. When the shifting magnetic field reaches zero, the film-plane perpendicular component Hz of the leakage magnetic field applied to the storage layer 102 becomes zero. Accordingly, the optimum film thickness $t_2$ to cancel the film-plane perpendicular component Hz of the leakage magnetic field is determined to be 12.7 nm.

Figure 15:
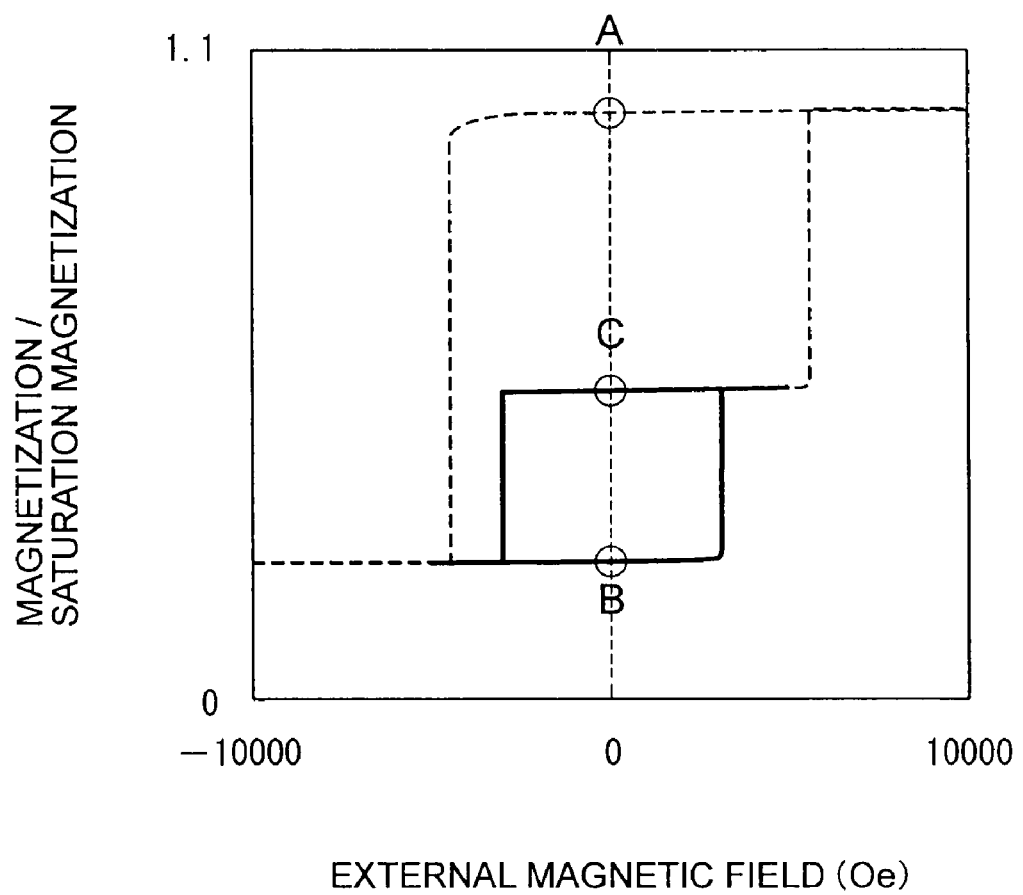
FIG. 15 is a diagram showing the hysteresis loop of magnetization in the third embodiment.
Figure 16:
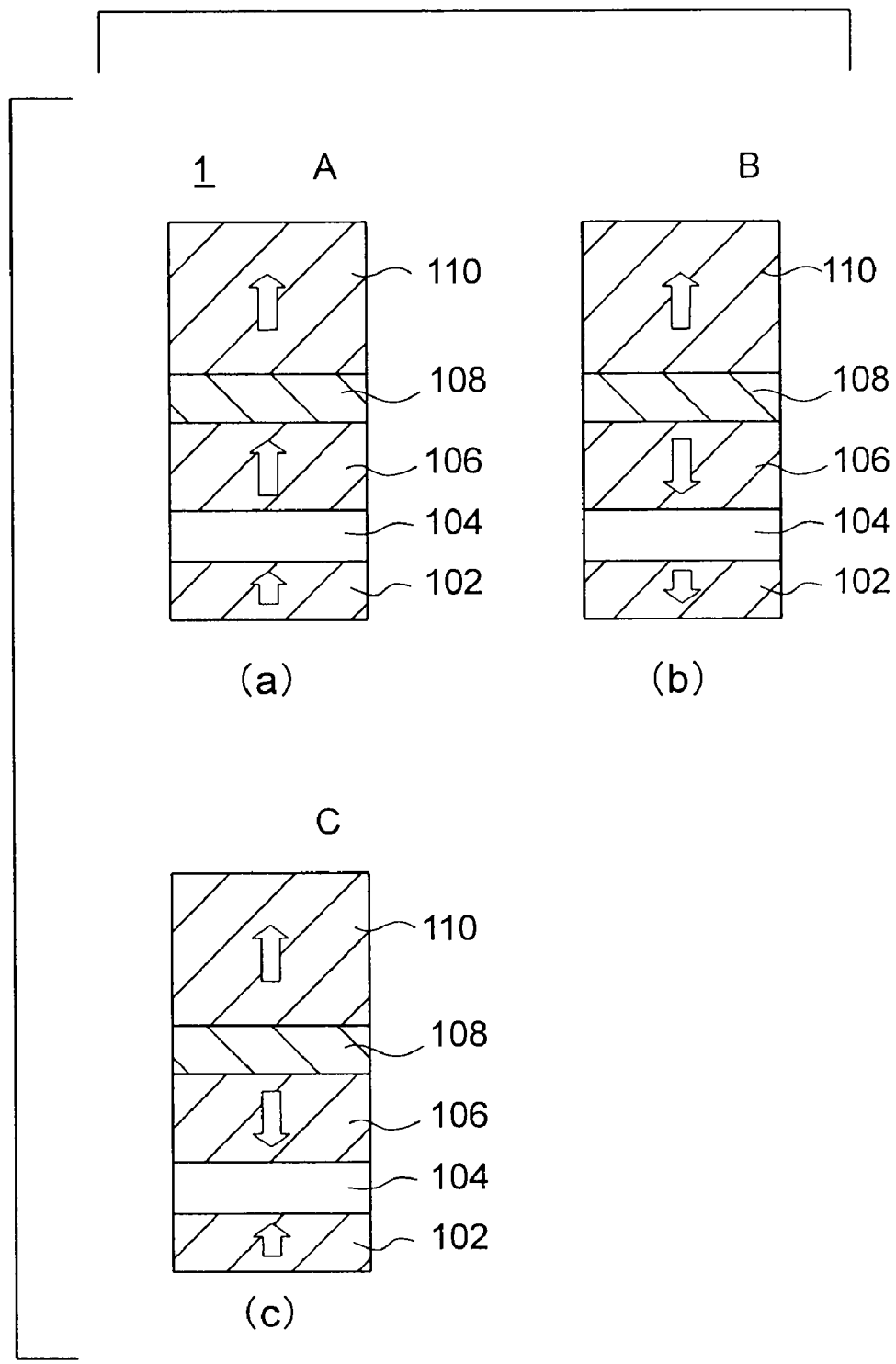
FIG. 16(a) is a diagram showing magnetization states of the magnetoresistive effect device observed when the external magnetic field is 0 Oe in the hysteresis loop shown in FIG. 15.
FIG. 16(b) is a diagram showing magnetization states of the magnetoresistive effect device observed when the external magnetic field is 0 Oe in the hysteresis loop shown in FIG. 15.
FIG. 16(c) is a diagram showing magnetization states of the magnetoresistive effect device observed when the external magnetic field is 0 Oe in the hysteresis loop shown in FIG. 15.

FIG. 15 shows the hysteresis loop of the MTJ device 1 obtained through a calculation performed where the optimum film thickness $t_2$ of the ferromagnetic layer 110 is 12.7 nm. This calculation is performed on the assumption that the antiferromagnetic layer 108 applies a magnetic field of 3000 Oe to the reference layer 106 as mentioned above, or the exchange coupling between the reference layer 106 and the antiferromagnetic layer 108 is 3000 Oe. In FIG. 15, the abscissa axis indicates the external magnetic field, and the ordinate axis indicates the value obtained by dividing the sum of the magnetization of the storage layer 102 and the magnetization of the reference layer 106 by the sum of the saturation magnetization of the storage layer 102 and the saturation magnetization of the reference layer 106. The solid lines represent the fluctuation of magnetization observed when the value of the external magnetic field is varied, with the maximum external magnetic field being set at 5000 Oe. The dotted lines represent the fluctuation of magnetization observed when the value of the external magnetic field is varied, with the maximum magnetic field being set at 10000 Oe. FIGS. 16(a), 16(b), and 16(c) illustrate the magnetization state at point A, point B, and point C where the external magnetic field becomes zero in the hysteresis loop shown in FIG. 15.

Where the magnetization state of the MTJ device 1 is the state A illustrated in FIG. 16(a), and a negative external magnetic field (in a downward direction in the drawings) of 10000 Oe is applied, the magnetization directions of the storage layer 102 and the reference layer 106 are reversed, and the magnetization state of the MTJ device 1 switches to the state B illustrated in FIG. 16(b). The external magnetic field of 1000 Oe reverses the magnetization directions of the storage layer 102 and the reference layer 106, but does not reverse the magnetization direction of the ferromagnetic layer 110. Where the magnetization state of the MTJ device 1 is the state B illustrated in FIG. 16(b), and a positive external magnetic field of 10000 Oe is applied, the magnetization directions of the storage layer 102 and the reference layer 106 are reversed, and the magnetization state of the MTJ device 1 switches to the state A illustrated in FIG. 16(a).

Where the magnetization state of the MTJ device 1 is the state B illustrated in FIG. 16(b), and a positive external magnetic field (in an upward direction in the drawings) of 5000 Oe is applied (equivalent to a case where an electron current flows from the storage layer 102 to the reference layer 106), the magnetization direction of the storage layer 102 is reversed, and the magnetization state of the MTJ device 1 switches to the state C illustrated in FIG. 16(c). The external magnetic field of 5000 Oe (an electron current) reverses the magnetization direction of the storage layer 102, but does not reverse the magnetization direction of the reference layer 106. Where the magnetization state of the MTJ device 1 is the state C illustrated in FIG. 16(c), and a negative external magnetic field of 5000 Oe is applied (equivalent to a case where an electron current flows from the reference layer 106 to the storage layer 102), the magnetization direction of the storage layer 102 is reversed, and the magnetization state of the MTJ device 1 switches to the state B illustrated in FIG. 16(b).

By controlling the states at the point B and the point C in this manner, the magnetization relationship between the storage layer 102 and the reference layer 106 can be switched between an antiparallel state and a parallel state.

Figure 17:
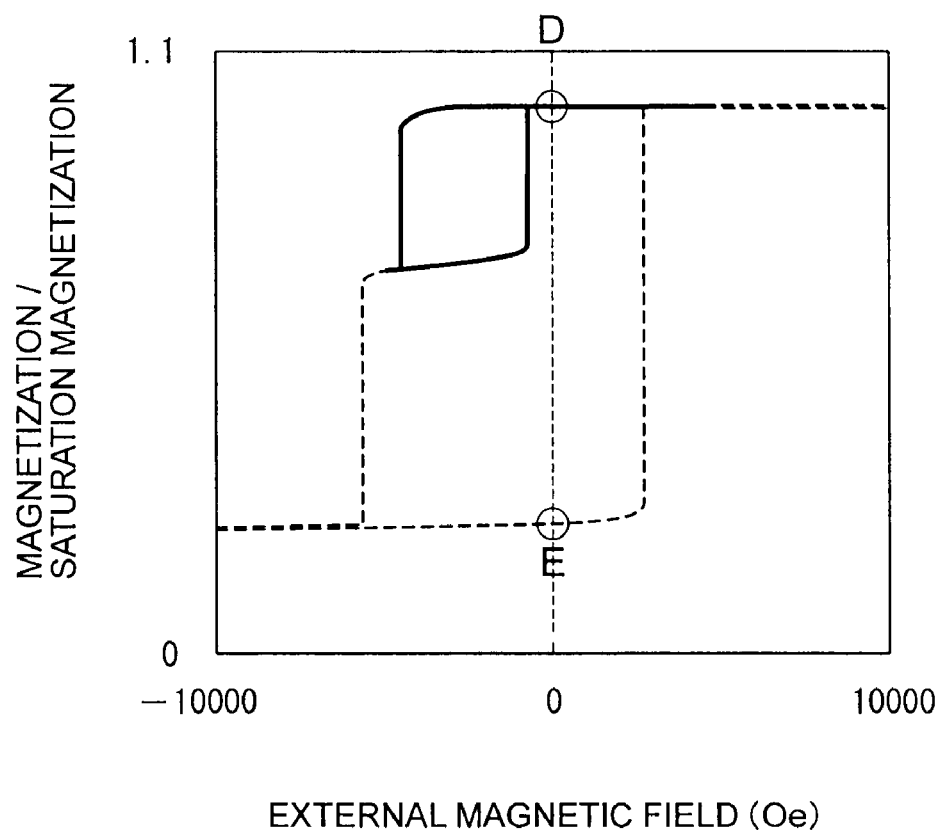
FIG. 17 is a diagram showing the hysteresis loop of magnetization in the third embodiment.
Figure 18:
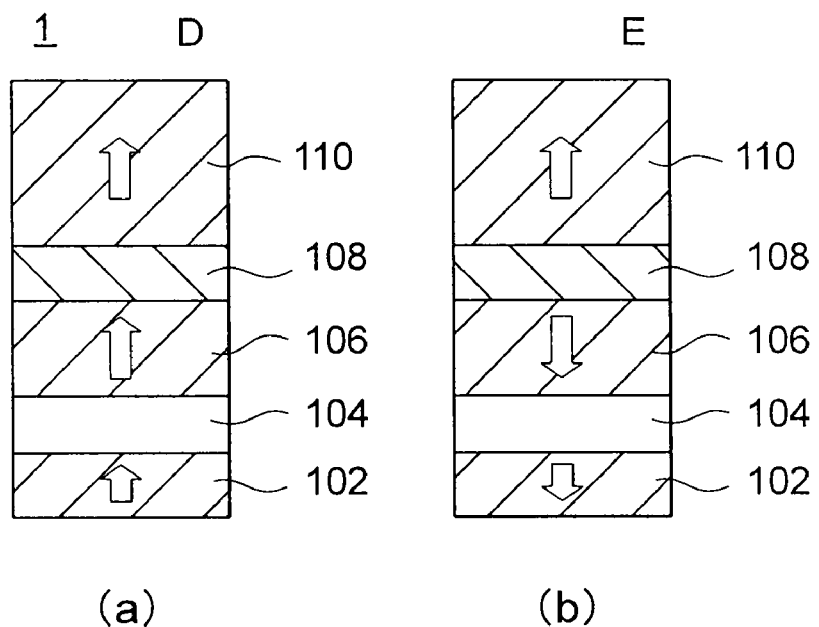
FIG. 18(a) is a diagram showing the magnetization states of the magnetoresistive effect device observed when the external magnetic field is 0 Oe in the hysteresis loop shown in FIG. 17.
FIG. 18(b) is a diagram showing the magnetization states of the magnetoresistive effect device observed when the external magnetic field is 0 Oe in the hysteresis loop shown in FIG. 17.

FIG. 17 shows the hysteresis loop of the MTJ device 1 determined in the calculation of the hysteresis loop shown in FIG. 15, with the strength of the exchange coupling between the reference layer 106 and the antiferromagnetic layer 108 being 0 Oe. In FIG. 17, the abscissa axis indicates the external magnetic field, and the ordinate axis indicates the value obtained by dividing the sum of the magnetization of the storage layer 102 and the magnetization of the reference layer 106 by the sum of the saturation magnetization of the storage layer 102 and the saturation magnetization of the reference layer 106. The solid lines represent the fluctuation of magnetization observed when the value of the external magnetic field is varied, with the maximum external magnetic field being set at 5000 Oe. The dotted lines represent the fluctuation of magnetization observed when the value of the external magnetic field is varied, with the maximum magnetic field being set at 10000 Oe. FIGS. 18(a) and 18(b) illustrate the magnetization states at point D and point E where the external magnetic field becomes 0 Oe in the hysteresis loop shown in FIG. 17. When the exchange coupling between the reference layer 106 and the antiferromagnetic layer 108 is 0 Oe, the magnetization state is only in the state D or E. When the external magnetic field is 0 Oe, the magnetization directions of the storage layer 102 and the reference layer 106 cannot be put into an antiparallel state. This is because the reference layer 106 is affected by the leakage magnetic field of the ferromagnetic layer 110 and the storage layer 102. In the state C illustrated in FIG. 16(c), the ferromagnetic layer 110 and the storage layer 102 subjects the reference layer 106 to a torque that directs magnetization upward. If the reference layer 106 has sufficient magnetic anisotropy against the upward torque, the magnetization direction of the reference layer 106 is not reversed. However, if the magnetic anisotropy is small, the magnetization direction of the reference layer 106 is reversed, and the magnetization state switches to the state D illustrated in FIG. 18(a).

To switch the magnetization directions of the storage layer 102 and the reference layer 106 between a parallel state and an antiparallel state when the external magnetic field is zero, any of the following methods may be implemented: supplying an exchange coupling magnetic field from the antiferromagnetic layer 108 to the reference layer 106 as in this embodiment; increasing the film thickness of the reference layer 106; and selecting a material having a large material magnetic anisotropy energy for the reference layer 106. By increasing the film thickness of the reference layer 106, however, the leakage magnetic field from the reference layer 106 increases, and the ferromagnetic layer 110 is required to have a greater film thickness to cancel the leakage magnetic field from the reference layer 106. As a result, the total film thickness of the magnetoresistive effect device increases, and the write current variation becomes wider. Further, there is an increase in production costs. Meanwhile, by selecting a material having a large material magnetic anisotropy energy for the reference layer 106, the reference layer 106 needs to have a certain film thickness to maintain a sufficient volume of activation in the reference layer 106. Therefore, the ferromagnetic layer 110 is required to have a greater film thickness to cancel the leakage magnetic field from the reference layer 106. On the other hand, where the antiferromagnetic layer 108 is interposed between the reference layer 106 and the ferromagnetic layer 110, and supplies an exchange coupling magnetic field to the reference layer 106, the film thickness of the reference layer 106 can be reduced. Accordingly, the total film thickness of the magnetoresistive effect device becomes smaller, and the write current variation becomes narrower. Furthermore, as the film thickness of the magnetoresistive effect device becomes smaller, the production costs are lowered.

Figure 19:
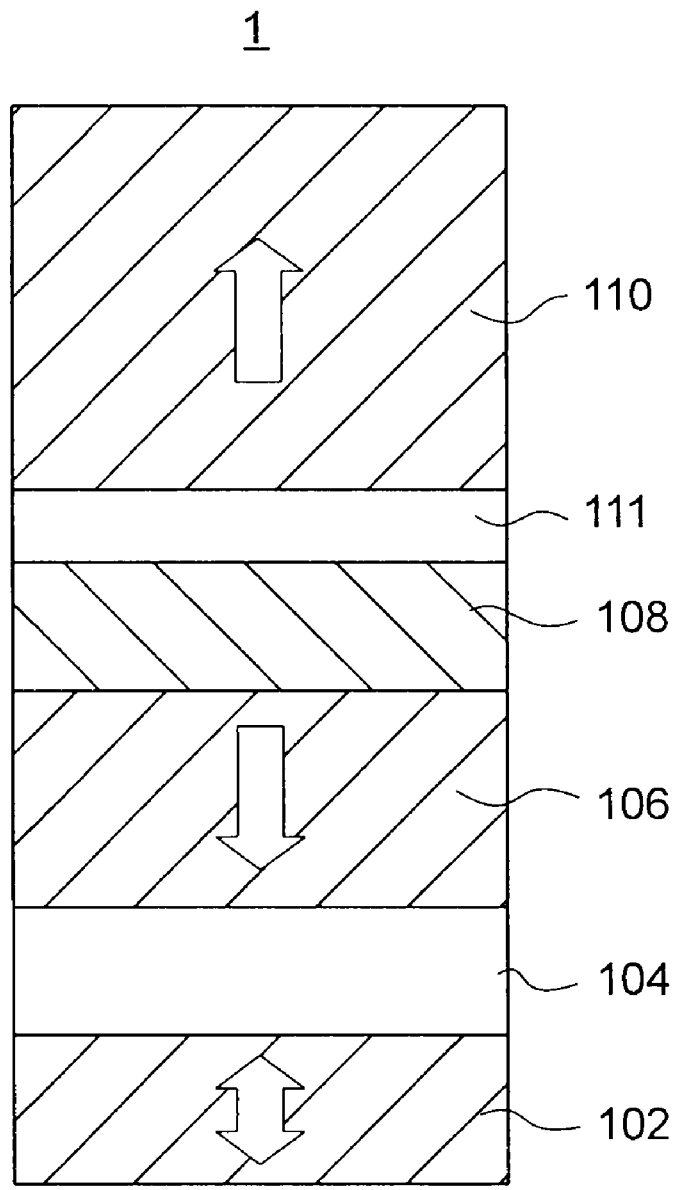
FIG. 19 is a cross-sectional view of a magnetoresistive effect device in accordance with a modification of the third embodiment.

It is desirable that strong exchange coupling is caused between the reference layer 106 and the antiferromagnetic layer 108. On the other hand, it is desirable that no exchange coupling is caused between the ferromagnetic layer 110 and the antiferromagnetic layer 108. The reasons for that will be described later in case 1 and case 2. For example, as shown in FIG. 19, a nonmagnetic layer 111 may be interposed between the antiferromagnetic layer 108 and the ferromagnetic layer 110, so that the exchange coupling caused between the antiferromagnetic layer 108 and the ferromagnetic layer 110 is reduced by the nonmagnetic layer 111. It is desirable that the nonmagnetic layer 111 is made of a material that is not diffusible with the antiferromagnetic layer 108 and the ferromagnetic layer 110. For example, it is desirable that the nonmagnetic layer 111 is made of a metal having a high melting point, such as Mo, Nb, Ta, W, Ir, Rh, Os, Re, or Ru. Also, the film thickness of the nonmagnetic layer 111 interposed between the antiferromagnetic layer 108 and the ferromagnetic layer 110 should be approximately 1 nm or greater, so as to weaken the exchange coupling between the antiferromagnetic layer 108 and the ferromagnetic layer 110.

For example, in the structure illustrated in FIG. 13, the storage layer 102 having a stacked structure of a 2-nm thick FePd film and a 1-nm thick CeFeB film formed on the FePd film is formed, the nonmagnetic layer 104 formed with a 1-nm thick MgO film is placed on the CoFeB film of the storage layer 102, and the reference layer 106 having a stacked structure of a 1.5-nm CoFe film and a 3.5-nm thick FePt film formed on the CoFe film is further formed on the nonmagnetic layer 104. After a 3-nm PtMn film is formed, a 350-° C. heat treatment is carried out while a magnetic field is applied in a direction substantially perpendicular to the film plane. In this manner, exchange coupling can be caused between the reference layer 106 and the antiferromagnetic layer 108. The ferromagnetic layer 110 formed with a FePt film of 10 nm to 20 nm is further placed on the antiferromagnetic layer 108. Thus, a film that zeroes the film-plane perpendicular component Hz of the leakage magnetic field applied to the storage layer 102 from the reference layer 106 can be formed.

To make the magnetization directions of the reference layer 106 and the ferromagnetic layer 110 antiparallel to each other, a magnetic field of a direction that is perpendicular to the film plane but is opposite to the direction of the exchange coupling magnetic field between the antiferromagnetic layer 108 and the reference layer 106 is applied after a MRAM chip including the MTJ devices 1 as memory elements is completed. In this manner, the magnetization of the ferromagnetic layer 110 is set in one direction.

A magnetic field of a direction that is perpendicular to the film plane and is the same as the direction of the exchange coupling magnetic field between the antiferromagnetic layer 108 and the reference layer 106 is next applied, so that the magnetization direction of the reference layer 106 is reversed. At this point, the intensity of the magnetic field applied so as to reverse the reference layer 106 needs to be within such a range as not to reverse the magnetization direction of the ferromagnetic layer 110. Furthermore, the magnetization directions of the reference layer 106 and the ferromagnetic layer 110 need to keep a thermally stable state while in an antiparallel state. Therefore, the following restrictions are necessary:

(Case 1: where the reference layer 106 and the ferromagnetic layer 110 are made of the same material)

In this case, either of the following two methods may be implemented.

(a) The film thickness of the ferromagnetic layer 110 is made greater than the film thickness of the reference layer 106, so that the magnetization reversing magnetic field of the ferromagnetic layer 110 is greater than the magnetization reversing magnetic field of the reference layer 106, even if the magnetization reversing magnetic field of the ferromagnetic layer 110 shifts due to the exchange coupling of the same direction caused at the interface between the antiferromagnetic layer 108 and the reference layer 106 and at the interface between the antiferromagnetic layer 108 and the ferromagnetic layer 110.

(b) As in the structure illustrated in FIG. 19, the nonmagnetic layer 111 is inserted between the antiferromagnetic layer 108 and the ferromagnetic layer 110.

(Case 2: where the reference layer 106 and the ferromagnetic layer 110 are made of different materials from each other)

In this case, either of the following two methods may be implemented:

(a) The materials are selected for the reference layer 106 and the ferromagnetic layer 110 having such perpendicular magnetic anisotropy that an antiparallel state can be maintained between the reference layer 106 and the ferromagnetic layer 110, and the thermal agitation resistance of the reference layer 106 and the ferromagnetic layer 110 in an antiparallel state is higher than the thermal agitation resistance of the storage layer 102, even if the thermal agitation resistance of the ferromagnetic layer 110 becomes lower due to the exchange coupling between the antiferromagnetic layer 108 and the ferromagnetic layer 110 when the exchange coupling of the same direction is caused at the interface between the antiferromagnetic layer 108 and the reference layer 106 and at the interface between the antiferromagnetic layer 108 and the ferromagnetic layer 110, and the reference layer 106 and the ferromagnetic layer 110 are put into an antiparallel state.

(b) As in the structure illustrated in FIG. 19, the nonmagnetic layer 111 is inserted between the antiferromagnetic layer 108 and the ferromagnetic layer 110.

The film thickness $t_2$ of the ferromagnetic layer 110 is determined by: (1) the size of the magnetoresistive effect device; (2) the distance between the reference layer 106 and the ferromagnetic layer 110; (3) the saturation magnetization $Ms_2$ of the ferromagnetic layer 110; (4) the saturation magnetization $Ms_1$ of the reference layer 106; and (5) the film thickness $t_1$ of the reference layer 106. Strictly speaking, the film thickness $t_2$ of the ferromagnetic layer 110 is determined after the above five parameters are clearly defined.

Figure 20:
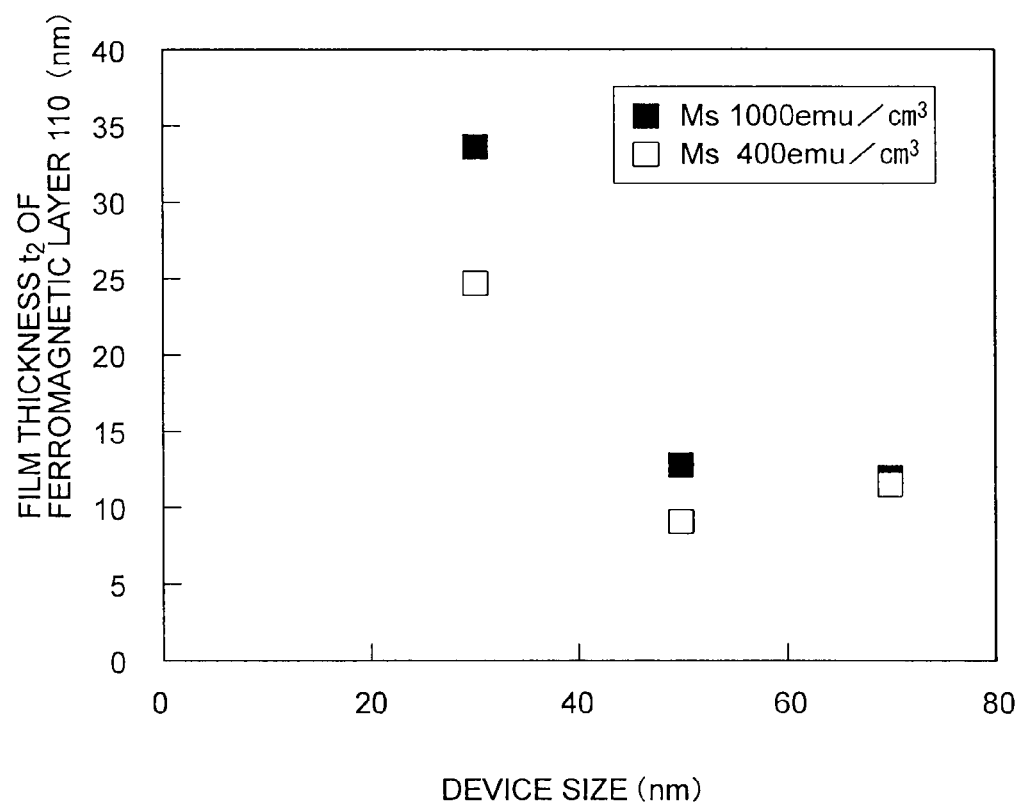
FIG. 20 is a diagram showing the dependence of the film thickness of the ferromagnetic layer on the size of the magnetoresistive effect device.

Example cases where magnetic materials having the same saturation magnetization are used for the reference layer 106 and the ferromagnetic layer 110 are now described. FIG. 20 shows the results of simulations performed with the use of a LLG equation to measure the film thickness $t_2$ of the ferromagnetic layer 110 required to cancel the leakage magnetic field applied to the storage layer 102 from the reference layer 6, with respect to the device size. The black square dots represent a case where magnetic materials of 1000 emu/cm$^3$ in saturation magnetization are used for the reference layer 106 and the ferromagnetic layer 110, and the white square dots represent a case where magnetic materials of 400 emu/cm$^3$ in saturation magnetization are used for the reference layer 106 and the ferromagnetic layer 110. A magnetic material of 1000 emu/cm$^3$ is used for the storage layer 102. In each of the example cases illustrated in FIG. 20, a 3-nm thick antiferromagnetic layer 108 is interposed between the reference layer 106 and the ferromagnetic layer 110. Also, an exchange coupling magnetic field of 1000 Oe is provided between the antiferromagnetic layer 108 and the reference layer 106. To achieve a large capacity, it is desirable that the size of the magnetoresistive effect device is 50 nm or less. As can be seen from FIG. 20, as the device size becomes smaller, the film thickness $t_2$ of the ferromagnetic layer 110 required to cancel the leakage magnetic field from the reference layer 106 becomes greater. An increase of the film thickness of the ferromagnetic layer 110 is not desirable, because it leads to an increase in production costs. To avoid such a problem, a material having small saturation magnetization should be used for the reference layer 106, the film thickness $t_1$ of the reference layer 106 should be reduced, or the film thickness of the antiferromagnetic layer 108 should be reduced, for example.

Figure 21:
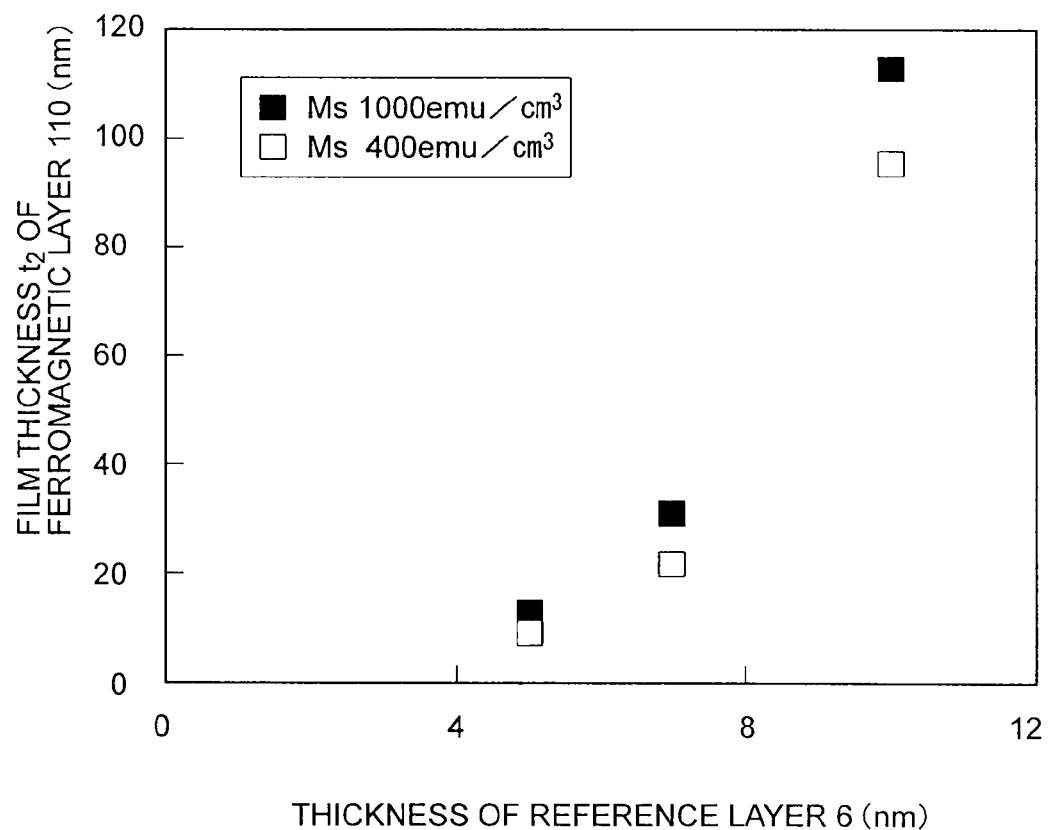
FIG. 21 is a diagram showing the dependence of the film thickness of the ferromagnetic layer on the film thickness of the reference layer in the magnetoresistive effect device.

FIG. 21 shows the results of simulations performed with the use of a LLG equation to measure the film thickness $t_2$ of the ferromagnetic layer 110 required to cancel the leakage magnetic field applied to the storage layer 102 from the reference layer 6 with respect to the film thickness of the reference layer 106. The black square dots represent a case where magnetic materials of 1000 emu/cm$^3$ in saturation magnetization are used for the reference layer 106 and the ferromagnetic layer 110, and the white square dots represent a case where magnetic materials of 400 emu/cm$^3$ in saturation magnetization are used for the reference layer 106 and the ferromagnetic layer 110. The same conditions in the cases illustrated in FIG. 20 are applied to the storage layer 102 and the antiferromagnetic layer 108. The MTJ device has a circular shape of 50 nm in diameter. As in the cases illustrated in FIG. 20, the film thickness $t_2$ of the ferromagnetic layer 110 is smaller, when the saturation magnetization $Ms_1$ of the reference layer 106 is smaller. Also, the film thickness $t_2$ of the ferromagnetic layer 110 is smaller, when the film thickness $t_1$ of the reference layer 106 is smaller. For example, in a comparison between the reference layer 106 and the ferromagnetic layer 110, the leakage magnetic field applied to the storage layer 102 from the reference layer 106 can be restrained, if at least one of the two following requirements is satisfied: the saturation magnetization $Ms_1$ of the reference layer 106 is made smaller than the saturation magnetization $Ms_2$ of the ferromagnetic layer 110; and the film thickness $t_1$ of the reference layer 106 is made smaller than the film thickness $t_2$ of the ferromagnetic layer 110. However, the thinning of the reference layer 106 has a limitation, because the reference layer 106 needs to have sufficient thermal agitation resistance.

With the above described structure, the magnetoresistive effect device of this embodiment can minimize the leakage magnetic field applied to the storage layer.

Next, magnetic materials having perpendicular magnetic anisotropy used for the storage layer 102, the reference layer 106, and the ferromagnetic layer 110 in the third embodiment are described. Examples of the perpendicular magnetization materials that can be used in the MTJ device of this embodiment are as follows.

(1) Ordered Alloys

An ordered alloy of a $L1_0$ structure having a FCT (Face-Centered Tetragonal) structure as the fundamental structure that is (001) plane-oriented with respect to the in-plane direction.

Examples of the magnetic materials of the storage layer 102 and the reference layer 106 include an ordered alloy that has a $L1_0$ structure as the crystalline structure, and contains at least one element selected from the group consisting of iron (Fe), cobalt (Co), nickel (Ni), and manganese (Mn), and at least one element selected from the group consisting of platinum (Pt), palladium (Pd), rhodium (Rh), and aluminum (Al). For example, such ordered alloys may be $Fe_{50}Pt_{50}$, $Fe_{50}Pd_{50}$, $Co_{50}Pt_{50}$, $Fe_{30}Ni_{20}Pt_{50}$, $Fe_{50}Pt_{30}Rh_{20}$, $CO_{30}Ni_{20}Pt_{50}$, $Mn_{50}Al_{50}$, and the like. The above composition ratios of the ordered alloys are merely examples, and the ordered alloys are not limited to those composition ratios. The magnetic anisotropy energy density and the saturation magnetization can be adjusted to low values by adding an impurity single element such as copper (Cu), zinc (Zn), silver (Ag), nickel (Ni), cobalt (Co), iron (Fe), manganese (Mn), chromium (Cr), vanadium (V), titanium (Ti), osmium (Os), iridium (Ir), or boron (B), or an alloy of those materials, or an insulating material, to those ordered alloys. Also, by adjusting the composition ratios, a mixed layer of an ordered alloy of a $L1_0$ structure and an ordered alloy of a $L1_2$ structure may be used.

(2) Disordered Alloys

It is possible to use a disordered alloy that contains cobalt (Co) as the main component, and also contains at least one element selected from the group consisting of chromium (Cr), tantalum (Ta), niobium (Nb), vanadium (V), tungsten (W), hafnium (Hf), titanium (Ti), zirconium (Zr), platinum (Pt), palladium (Pd), iron (Fe), and nickel (Ni). Examples of such disordered alloys include CoCr alloys, CoPt alloys, CoCrTa alloys, CoCrPt alloys, CoCrPtTa alloys, and CoCrNb alloys. With any of those alloys, the magnetic anisotropy energy density and the saturation magnetization can be adjusted by increasing the proportion of the nonmagnetic element.

(3) Artificial Lattices

It is also possible to use an artificial lattice having a stack film formed by alternately stacking an alloy film containing at least one element selected from the group consisting of iron (Fe), cobalt (Co), and nickel (Ni), and an alloy film containing at least one element selected from the group consisting of chromium (Cr), platinum (Pt), palladium (Pd), iridium (Ir), rhodium (Rh), ruthenium (Ru), osmium (Os), rhenium (Re), gold (Au), and copper (Cu). Examples of such artificial lattices include a Co/Pt artificial lattice, a Co/Pd artificial lattice, a CoCr/Pt artificial lattice, a Co/Ru artificial lattice, a Co/Os artificial lattice, a Co/Au artificial lattice, and a Ni/Cu artificial lattice. With any of those artificial lattices, the magnetic anisotropy energy density and the saturation magnetization can be adjusted by adding an element to the magnetic layer and controlling the film thickness ratio between the magnetic layer and the nonmagnetic layer.

(4) Heavy Rare-Earth Metal

It is also possible to use a magnetic material formed with an alloy of a heavy rare-earth metal and a transition metal. For example, an amorphous alloy that contains at least one element selected from the group consisting of terbium (Tb), dysprosium (Dy), gadolinium (Gd), and a transition metal may be used. Alternatively, an alloy that contains at least one element selected from the group consisting of samarium (Sm), neodymium (Nd), dysprosium (Dy), and a transition metal may be used. Examples of such alloys include TbFe, TbCo, TbFeCo, DyTbFeCo, GdTbCo, SmCo, NdCo, and DyCo. The magnetic anisotropy energy density and the saturation magnetization can be adjusted by controlling the composition ratios in those alloys.

Alternatively, the storage layer 102 and the reference layer 106 may be formed with stack films each having CoFeB or CoFe or Fe with high polarizability at the interface in contact with the nonmagnetic layer 104. In this manner, a magnetoresistive effect device having a high MR ratio can be formed.

(Fourth Embodiment)

Figure 22:
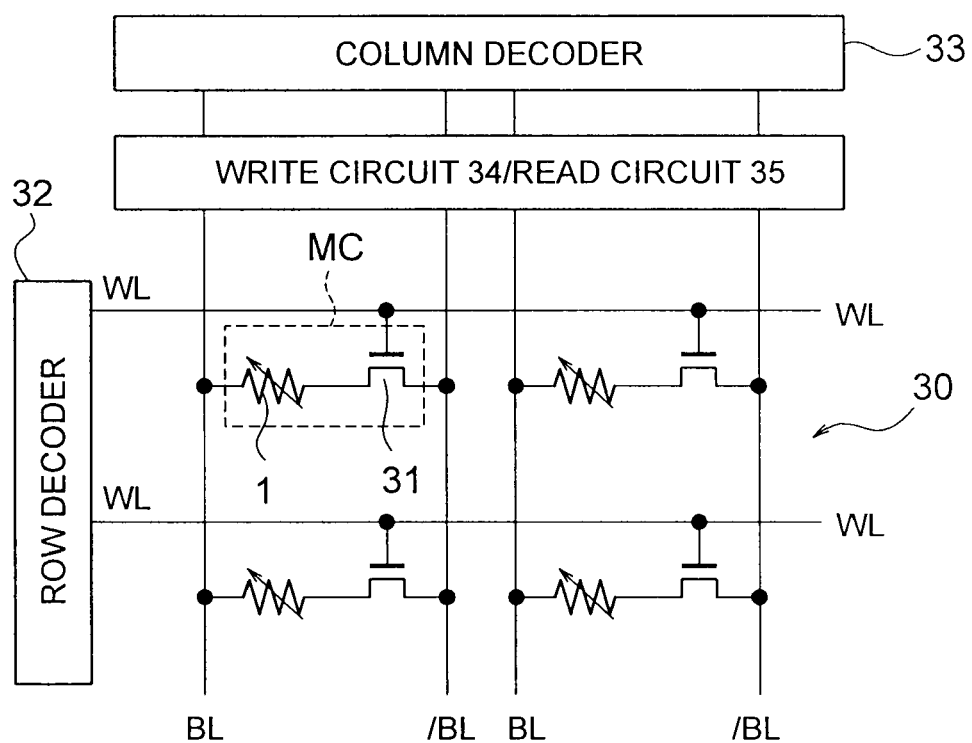
FIG. 22 is a circuit diagram of a magnetic memory in accordance with a fourth embodiment.
Figure 23:
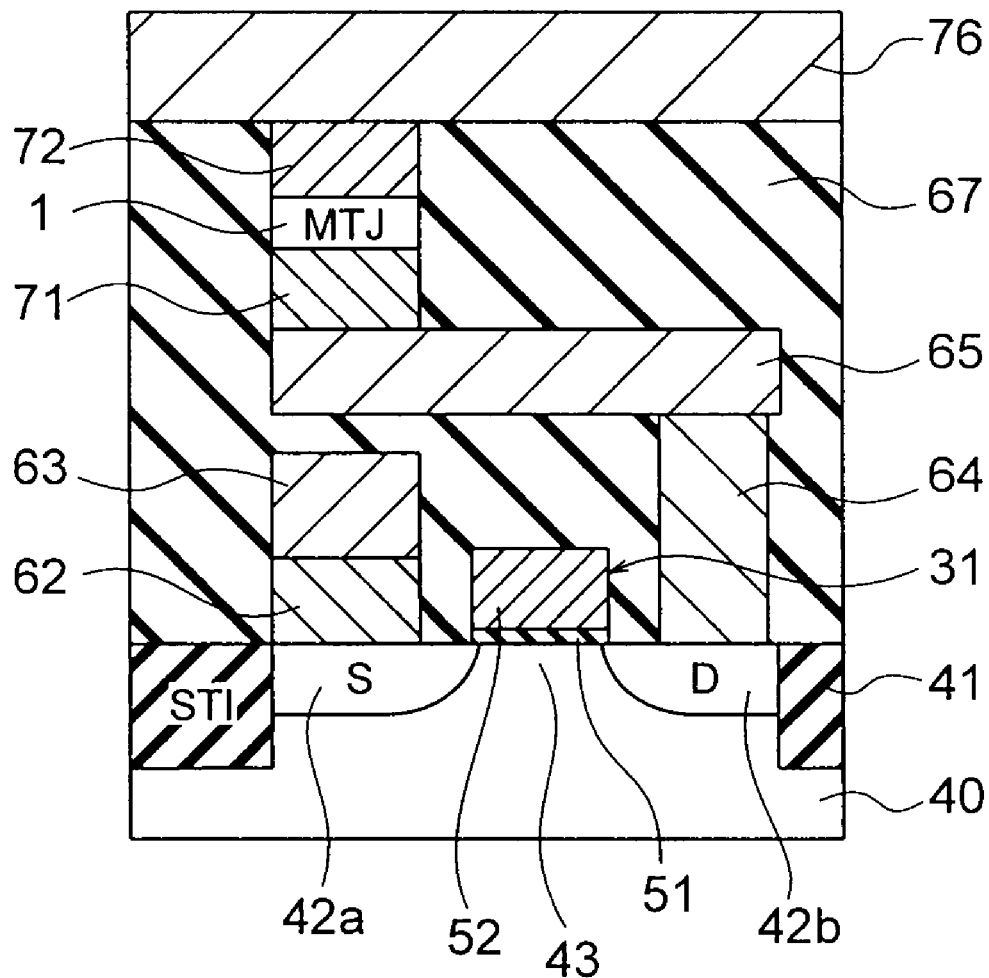
FIG. 23 is a cross-sectional view of a memory cell in the magnetic memory of the fourth embodiment.

Referring now to FIGS. 22 and 23, a magnetic memory (MRAM) in accordance with a fourth embodiment of the present invention is described.

FIG. 22 is a circuit diagram of the MRAM of this embodiment. The MRAM of this embodiment include MTJ devices 1 of any of the first through third embodiments as the storage elements of memory cells. This MRAM has a memory cell array 30 including memory cells MC arranged in a matrix fashion. In the memory cell array 30, bit lines BL and /BL are arranged so as to extend in the column direction. In the memory cell array 30, word lines WL are also arranged so as to extend in the row direction.

The memory cells MC are placed at the respective intersecting portions of the bit lines BL and the word lines WL. Each of the memory cells MC includes a MTJ device 1 and a select transistor 31 formed with an n-channel MOS transistor. One end of the MTJ device 1 is connected to the corresponding bit line BL. The other end of the MTJ device 1 is connected to the drain terminal of the select transistor 31. The gate terminal of the select transistor 31 is connected to the corresponding word line WL. The source terminal of the select transistor 31 is connected to the corresponding bit line /BL.

A row decoder 32 is connected to the word lines WL. A write circuit 34 and a read circuit 35 are connected to the bit lines BL and /BL. A column decoder 33 is connected to the write circuit 34 and the read circuit 35. Each of the memory cells MC is to be selected through the row decoder 32 and the column decoder 33.

Data writing into a memory cell MC is performed in the following manner. First, to select the memory cell MC on which data writing is to be performed, the word line WL connected to this memory cell MC is activated. Through the activation, the select transistor 31 is put into an ON state. At this point, a bidirectional write current Iw depending on the write data is supplied to the MTJ device 1. More specifically, when the write current Iw is supplied from left to right in FIG. 22 to the MTJ device 1, the write circuit 34 applies a positive voltage to the bit line BL, and applies a ground voltage to the bit line /BL. When the write current Iw is supplied from right to left in FIG. 22 to the MTJ device 1, the write circuit 34 applies a positive voltage to the bit line /BL, and applies a ground voltage to the bit line BL. In this manner, data "0" or data "1" can be written into the memory cell MC.

Data reading from a memory cell MC is performed in the following manner. First, to select the memory cell MC on which data reading is to be performed, the word line WL connected to this memory cell MC is activated. Through the activation, the select transistor 31 of the selected memory cell MC is put into an ON state. The read circuit 35 supplies a read current Ir flowing from right to left in FIG. 22 to the MTJ device 1, for example. Based on the read current Ir, the read circuit 35 detects the resistance value of the MTJ device 1. In this manner, the data stored in the MTJ device 1 can be read out.

The structure of the MRAM is now described. FIG. 23 is a cross-sectional view showing the structure of one of the memory cells MC in the MRAM.

Device isolation insulating layers 41 are formed at certain portions of the surface region of a p-type semiconductor substrate 40. The rest of the surface region of the semiconductor substrate 40 on which the device isolation insulating layers 41 are not formed serves as active areas in which devices are to be formed. The device isolation insulating layers 41 may be formed through STI (Shallow Trench Isolation), for example. Silicon oxide may be used for the STI, for example.

The select transistor 31 is formed in each of the active areas of the semiconductor substrate 40. In the select transistor 31, a source region 42a and a drain region 42b are formed at a distance from each other. The source region 42a and the drain region 42b are n⁺-type diffusion regions formed by injecting high-density n⁺-type impurities into the semiconductor substrate 40. A gate insulating film 51 is formed on the region located between the source region 42a and the drain region 42b in the semiconductor substrate 40. The region between the source region 42a and the drain region 42b serves as a channel 43. A gate electrode 52 is placed on the gate insulating film 51. The gate electrode 52 functions as the word line WL.

A wiring layer 63 is provided on the source region 42a via a contact 62. The wiring layer 63 functions as the bit line /BL. An extension line 65 is provided on the drain region 42b via a contact 64. The MTJ device 1 interposed between a lower electrode 71 and an upper electrode 72 is provided on the extension line 65. A wiring layer 76 is provided on the upper electrode 72. The wiring layer 76 functions as the bit line BL. The space between the semiconductor substrate 40 and the wiring layer 76 is filled with an interlayer insulating layer 67 formed with silicon oxide, for example.

In accordance with this embodiment, a MRAM can be formed with the MTJ device 1 of any of the first through third embodiments. The MTJ device 1 may also be used in magnetic memories of a domain wall displacement type as well as in magnetic memories of a spin injection type.

As described so far, each of the embodiments of the present invention can provide a magnetoresistive effect device that can minimize the leakage magnetic field applied to the storage layer, and a magnetoresistive access memory including the magnetoresistive effect device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A magnetic memory comprising a memory cell, the memory cell comprising:
a magnetoresistive effect device; and
a first electrode and a second electrode that flow a current to the magnetoresistive effect device,
the magnetoresistive effect device comprising:
a first ferromagnetic layer that has magnetic anisotropy in a direction perpendicular to a film plane thereof;
a first nonmagnetic layer that is provided on the first ferromagnetic layer;
a first reference layer that is provided on the first nonmagnetic layer, has magnetic anisotropy in a direction perpendicular to a film plane thereof, has magnetization antiparallel to a magnetization direction of the first ferromagnetic layer, and has a film thickness that is 1/5.2 to 1/1.5 times as large as a film thickness of the first ferromagnetic layer in the direction perpendicular to the film plane;
a second nonmagnetic layer that is provided on the first reference layer; and
a storage layer that is provided on the second nonmagnetic layer, has magnetic anisotropy in a direction perpendicular to a film plane thereof, and has a magnetization direction varied by spin-polarized electrons caused by flowing the current to the magnetoresistive effect device.

2. The memory according to claim 1, wherein $Ms_1$ represents saturation magnetization of the first reference layer, $t_1$ represents the film thickness of the first reference layer, $Ms_2$ represents saturation magnetization of the first ferromagnetic layer, $t_2$ represents the film thickness of the first ferromagnetic layer, and a relationship, $$2.0 \leq (Ms_2 \times t_2)/(Ms_1 \times t_1) \leq 10.75,$$

is satisfied.

3. The memory according to claim 1, wherein $T_1$ represents Curie temperature of the first reference layer, $T_2$ represents Curie temperature of the first ferromagnetic layer, and the relationship, $$T_1 < T_2,$$

is satisfied.

4. The memory according to claim 1, further comprising:
a third nonmagnetic layer that is provided on the storage layer;
a second reference layer that is provided on the third nonmagnetic layer, has magnetic anisotropy in a direction perpendicular to a film plane thereof, and has magnetization antiparallel to the magnetization direction of the first reference layer;
a fourth nonmagnetic layer that is provided on the second reference layer; and
a second ferromagnetic layer that is provided on the fourth nonmagnetic layer, has magnetic anisotropy in a direction perpendicular to a film plane thereof, has magnetization antiparallel to the magnetization direction of the second reference layer, and has a film thickness that is 1.5 to 5.2 times as large as a film thickness of the second reference layer in the direction perpendicular to the film plane.

5. The memory according to claim 4, wherein $Ms_{11}$ and $Ms_{12}$ represent saturation magnetization of the first reference layer and saturation magnetization of the second reference layer, respectively, $t_{11}$ and $t_{12}$ represent the film thicknesses of the first reference layer and the second reference layer, respectively, $Ms_{21}$ and $Ms_{22}$ represent saturation magnetization of the first ferromagnetic layer and saturation magnetization of the second ferromagnetic layer, respectively, and $t_{21}$ and $t_{22}$ represent the film thicknesses of the first ferromagnetic layer and the second ferromagnetic layer, respectively, and the relationships, $$2.0 \leq (Ms_{21} \times t_{21})/(Ms_{11} \times t_{11}) \leq 10.75, \text{ and}$$

$$2.0 \leq (Ms_{22} \times t_{22})/(Ms_{12} \times t_{12}) \leq 10.75$$

are satisfied.

6. The memory according to claim 4, wherein $T_1$ represents Curie temperature of the first reference layer, $T_2$ represents Curie temperature of the first ferromagnetic layer, $T_3$ represents Curie temperature of the second reference layer, and $T_4$ represents Curie temperature of the second ferromagnetic layer, and the relationships, $$T_1 < T_2, \text{ and}$$

$$T_3 < T_4$$

are satisfied.

7. A magnetic memory comprising a memory cell, the memory cell comprising:
a magnetoresistive effect device; and
a first electrode and a second electrode that flow a current to the magnetoresistive effect device,
the magnetoresistive effect device comprising:
  a storage layer that has magnetic anisotropy in a direction perpendicular to a film plane thereof, and has a magnetization direction varied by spin-polarized electrons caused by flowing the current to the magnetoresistive effect device;
  a first nonmagnetic layer that is provided on the storage layer;
  a reference layer that is provided on the first nonmagnetic layer, and has magnetic anisotropy in a direction perpendicular to a film plane thereof;
  a second nonmagnetic layer that is provided on the reference layer; and
  a ferromagnetic layer that is provided on the second nonmagnetic layer, has magnetic anisotropy in a direction perpendicular to a film plane thereof, has magnetization antiparallel to a magnetization direction of the reference layer, and has a film thickness 1.5 to 5.2 times as large as a film thickness of the reference layer in the direction perpendicular to the film plane.

8. The memory according to claim 7, wherein $Ms_1$ represents saturation magnetization of the reference layer, $t_1$ represents the film thickness of the reference layer, $Ms_2$ represents saturation magnetization of the ferromagnetic layer, $t_2$ represents the film thickness of the ferromagnetic layer, and a relationship, $$2.0 \leq (Ms_2 \times t_2)/(Ms_1 \times t_1) \leq 10.75,$$

is satisfied.

9. The memory according to claim 7, wherein $T_1$ represents Curie temperature of the reference layer, $T_2$ represents Curie temperature of the ferromagnetic layer, and the relationship, $$T_1 < T_2,$$

is satisfied.

10. The memory according to claim 1, further comprising:
a first wiring that is electrically connected to the first electrode;
a second wiring that is electrically connected to the second electrode; and
a write circuit that is electrically connected to the first wiring and the second wiring, and supplies a bidirectional current to the magnetoresistive effect device.

11. The memory according to claim 10, further comprising:
a select transistor that is connected between the second electrode and the second wiring; and
a third wiring that controls switching on and off of the select transistor.

* * * * *